(12) United States Patent
Segal et al.

(10) Patent No.: US 8,008,856 B2
(45) Date of Patent: Aug. 30, 2011

(54) LIGHT EMITTING DEVICES WITH AGENT TO INCREASE THE FRACTION OF EXCITONS FORMED AS A SINGLET

(75) Inventors: Michael Segal, Cambridge, MA (US); Kelley Rivoire, Stanford, CA (US); Madhusudan Singh, Chandler, AZ (US); Marc A. Baldo, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 556 days.

(21) Appl. No.: 11/737,381

(22) Filed: Apr. 19, 2007

(65) Prior Publication Data

US 2007/0247067 A1    Oct. 25, 2007

Related U.S. Application Data

(60) Provisional application No. 60/792,952, filed on Apr. 19, 2006.

(51) Int. Cl.
*H01L 51/54* (2006.01)
*H01L 51/56* (2006.01)

(52) U.S. Cl. ............ 313/506; 313/504; 427/66

(58) Field of Classification Search .......... 313/498–512; 427/66; 445/24
See application file for complete search history.

(56) References Cited

U.S. PATENT DOCUMENTS

| | | |
|---|---|---|
| 3,912,931 A | 10/1975 | Gravisse et al. |
| 3,929,510 A | 12/1975 | Kittl |
| 4,029,519 A | 6/1977 | Schertz et al. |
| 4,110,123 A | 8/1978 | Goetzberger et al. |
| 4,127,425 A | 11/1978 | Chambers |
| 4,140,544 A | 2/1979 | Sill |
| 4,149,902 A | 4/1979 | Mauer et al. |
| 4,153,813 A | 5/1979 | Blieden et al. |
| 4,227,939 A | 10/1980 | Zewail |
| 4,292,959 A | 10/1981 | Coburn, Jr. |
| 4,324,946 A | 4/1982 | Gravisse |
| 4,329,535 A | 5/1982 | Rapp |
| 4,357,486 A | 11/1982 | Blieden et al. |
| 4,367,367 A | 1/1983 | Reisfeld et al. |
| 4,488,047 A | 12/1984 | Thomas |
| 4,799,748 A | 1/1989 | Brown |
| 4,884,860 A | 12/1989 | Brown |
| 6,310,360 B1 | 10/2001 | Forrest et al. |
| 6,476,312 B1 | 11/2002 | Barnham |
| 6,489,638 B2 | 12/2002 | Seo et al. |

(Continued)

FOREIGN PATENT DOCUMENTS

KR    20040053437    6/2004

(Continued)

OTHER PUBLICATIONS

Baldo et al., Nature, 403, pp. 750-753 (2000).*

(Continued)

*Primary Examiner* — Peter J MacChiarolo
*Assistant Examiner* — Steven Horikoshi
(74) *Attorney, Agent, or Firm* — Lando & Anastasi, LLP

(57) ABSTRACT

A light emitting device comprising a first electrode, a second electrode, an emissive material between the first and second electrodes and a mixing agent separate from the emissive material is disclosed. In certain examples, the mixing agent may be effective to increase a fraction of excitons formed as a singlet state.

24 Claims, 22 Drawing Sheets

U.S. PATENT DOCUMENTS

| | | | |
|---|---|---|---|
| 6,515,298 B2 | 2/2003 | Forrest et al. | |
| 6,570,083 B2 | 5/2003 | Gravisse et al. | |
| 6,572,987 B2 | 6/2003 | Seo | |
| 6,893,743 B2 | 5/2005 | Sato et al. | |
| 6,905,784 B2 | 6/2005 | Seo | |
| 6,917,159 B2 | 7/2005 | Tyan et al. | |
| 6,946,688 B2 | 9/2005 | Grushin et al. | |
| 6,992,437 B2 | 1/2006 | Lee et al. | |
| 7,034,454 B2 | 4/2006 | Kawai et al. | |
| 2002/0093006 A1 | 7/2002 | Vardeny et al. | |
| 2002/0146589 A1 | 10/2002 | Akiyama et al. | |
| 2002/0179899 A1 | 12/2002 | Nakayama et al. | |
| 2002/0197511 A1* | 12/2002 | D'Andrade et al. | 428/690 |
| 2005/0142383 A1 | 6/2005 | Igarashi et al. | |
| 2005/0147843 A1 | 7/2005 | Kobayashi et al. | |
| 2005/0158582 A1 | 7/2005 | Ise et al. | |
| 2005/0191521 A1* | 9/2005 | Vardeny et al. | 428/690 |
| 2006/0192482 A1 | 8/2006 | Igarashi et al. | |
| 2006/0220509 A1 | 10/2006 | Ghosh et al. | |
| 2006/0279203 A1 | 12/2006 | Forrest et al. | |
| 2006/0279204 A1 | 12/2006 | Forrest et al. | |

FOREIGN PATENT DOCUMENTS

| | | | |
|---|---|---|---|
| WO | WO 2005013387 A1 * | 2/2005 | |
| WO | 2006088370 | 8/2006 | |

OTHER PUBLICATIONS

D'andrade, Brian, High-efficiency yellow double-doped organic light-emitting devices based on phosphor-sensitized fluorescence, Applied Physics Letters, vol. 79, No. 7, Aug. 2001.*

Batchelder, J.S., et al., Luminescent Solar Concentrators 2: Experimental and theoretical analysis of their possible efficiencies, Applied Optics, vol. 20, No. 21, Nov. 1981.

Baldo, et al., Highly-efficient phosphorescent emission from organic electroluminescent devices, Nature, vol. 395, Sep. 1998.

Batchelder, J.S., et al., Luminescent Solar Concentrators 1: Theory of operation and techniques for performance evaluation, Applied Optics, vol. 18, No. 18, Sep. 1979.

International Search Report, EPO Searching Authority, PCT/US2007/009569, Filed Apr. 19, 2007.

Baldo et al. Nature, 403, pp. 750-753 (2000).

Burin, Alexander L., "Exciton Migration and Cathode Quenching in Organic Light Emitting Diodes", J. Phys. Chem., 2000, pp. 4704-4710, vol. 104.

Choong, V.-E., "Deposition-induced photoluminescence quenching of tris-(8-hydroxyquinoline) aluminum", Appl. Phys. Lett., Aug. 25, 1997, pp. 1005-1007, vol. 71 No. 8.

Choong, V.-E., "Photoluminescence quenching of Alq3 by metal deposition: A surface analytical investigation", J. Vac. Sci. Technol. A, May/Jun. 1998, vol. 16, No. 3.

M. Segal, "Extrafluorescent electroluminescence in organic light-emitting devices", Nature Materials, May 2007, vol. 6, pp. 374-378 (Exhibit B).

M. Wohlgenannt, "Formation cross-sections of singlet and triplet excitons in $\pi$-conjugated polymers", Nature, vol. 409, Jan. 25, 2001, pp. 494-497 (Exhibit A).

* cited by examiner

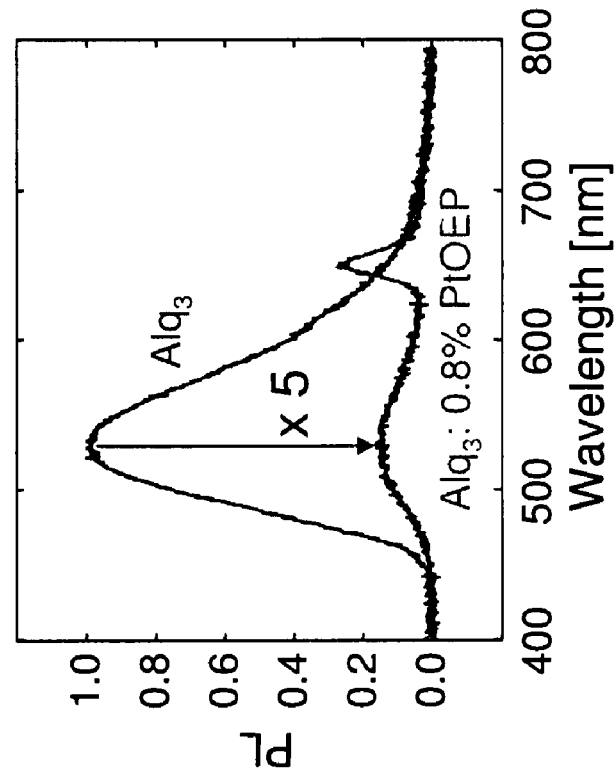
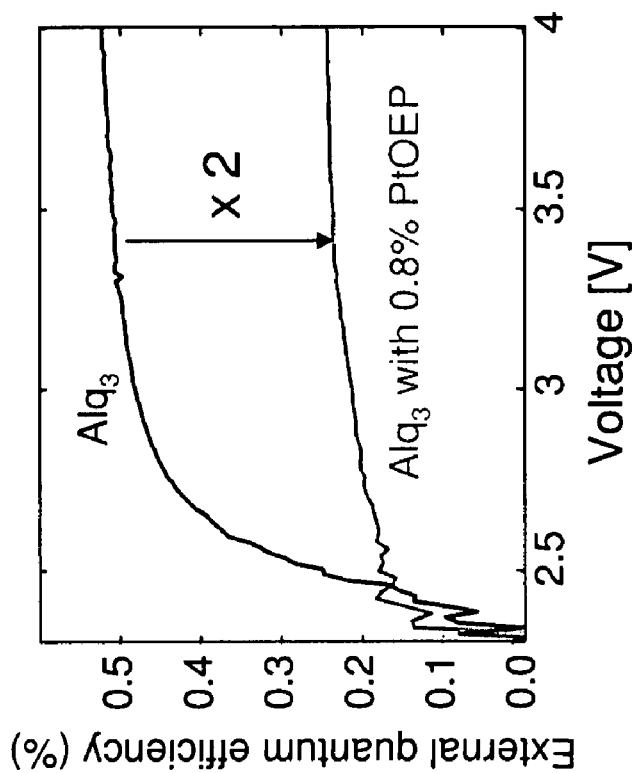
FIG. 4A
FIG. 4B

LIGHT EMITTING DEVICES WITH AGENT TO INCREASE THE FRACTION OF EXCITONS FORMED AS A SINGLET

PRIORITY APPLICATION

This application claims priority to U.S. Provisional Application No. 60/792,952 filed on Apr. 19, 2006, the entire disclosure of which is hereby incorporated herein by reference for all purposes.

FIELD OF THE TECHNOLOGY

Embodiments of the technology disclosed herein relate generally to light emitting devices. More particularly, certain embodiments disclosed herein are directed to a light emitting device comprising a mixing agent separate from an emissive material and effective to mix charge transfer states to increase a fraction of excitons formed as a singlet state.

BACKGROUND

Light-emitting devices can be used, for example, in displays (e.g., flat-panel displays), screens (e.g., computer screens), and other items that require illumination. Accordingly, brightness of the light-emitting device is one important feature of the device. Also, low operating currents and high efficiencies can improve the economic viability of producing emissive devices.

SUMMARY

In accordance with a first aspect, a light emitting device is provided. In certain examples, the light emitting device comprises a first electrode, a second electrode, an emissive material and a mixing agent separate from the emissive material. In some examples, the emissive material may be between the first and second electrodes. In certain examples, the mixing agent may be between at least one of the first electrode and the emissive material or the second electrode and the emissive material (or both). In some examples, the mixing agent may be effective to increase a fraction of excitons formed as a singlet state. In certain examples, the increase in the fraction of excitons formed as a singlet state may occur by mixing of charge transfer states.

In certain examples, the first electrode may be configured to be biased by an energy source to provide electrons. In some examples, the mixing agent may be non-emissive, whereas in other examples, the mixing agent may be non-emissive at wavelengths greater than an emission wavelength of the emissive material. In certain examples, the device may further comprise an electron transport layer between the first electrode and the emissive material. In some examples, the mixing agent may be in the electron transport layer. In other examples, the device may further comprise a hole transport layer between the second electrode and the emissive material. In certain examples, the mixing agent may be in the hole transport layer or in both the electron and hole transport layer. In certain examples, the mixing agent may comprise at least one complexed transition metal. In some examples, the mixing agent may include a complexed heavy atom that is buffered from adjacent molecules by ligands of the complexed heavy atom to reduce triplet state exciton formation. In certain examples, the mixing agent may be effective to increase the fraction of excitons formed as a singlet state to greater than 25% of the total excitons formed. In some examples, the mixing agent is effective to convert triplet charge transfer states into singlet charge transfer states. In other examples, the mixing agent comprises an atom having an atomic number greater than or equal to 37. In certain examples, the mixing agent comprises an atom having an atomic number from 71 to 85. In some examples, the emissive material may be selected to emit blue light. In certain embodiments, the mixing agent may be arranged in a separate layer to mix charge transfer states to increase a fraction of excitons formed as a singlet state without substantial mixing of formed excitons.

In accordance with another aspect, a method of providing a light emitting device is disclosed. In certain examples, the method comprises providing a first electrode, a second electrode, and an emissive material between the first electrode and the second electrode, and providing a mixing agent between the first electrode and the second electrode and separate from the emissive material, the mixing agent effective to increase a fraction of excitons formed as a singlet state.

In certain examples, the method may further comprise applying a voltage across the first electrode and the second electrode of the light emitting device to provide emission from the emissive material. In other examples, the mixing agent may be effective to mix exciton precursor states to increase the fraction of excitons formed as a singlet state. In some examples, the method may further comprise configuring the applied voltage (or current) to be at least 10% lower than an applied voltage needed to generate a substantially similar emission from a light emitting device comprising the first electrode, the second electrode, the emissive material and no mixing agent. In certain examples, the method may comprise configuring the first electrode to be biased by an energy source to provide electrons. In other examples, the method may comprise providing an electron transport layer between the first electrode and the emissive material. In additional examples, the method may comprise providing a hole transport layer between the second electrode and the emissive material. In some examples, the method may comprise an atom having an atomic number greater than or equal to 37 as the mixing agent. In certain examples, the atom may have an atomic number from 71 to 85.

In accordance with an additional aspect, a light emitting device configured to emit light by fluorescence and comprising a mixing agent separate from an emissive material and effective to provide a fluorescence emission intensity substantially similar to a fluorescence emission intensity of a light emitting device without the mixing agent is provided. In certain examples, the light emitting device with the mixing agent may be configured to emit the light by fluorescence at a current that is at least 10% less than a current used to operate the light emitting device without the mixing agent. In some examples, the light emitting device with the mixing agent comprises an emissive material configured to emit blue light.

In accordance with another aspect, a light emitting device comprising a mixing agent separate from an emissive material and operative at a first current, the light emitting device constructed and arranged to provide a lifetime that is at least 20% greater than a light emitting device without the mixing agent when the light emitting device without the mixing agent is operated at the first current is disclosed. In certain examples, the light emitting device with the mixing agent comprises an emissive material configured to emit blue light.

In accordance with an additional aspect, a light emitting device comprising an emissive material and a mixing agent separate from the emissive material, the device constructed and arranged to provide an increase in quantum efficiency by at least 10% when compared to a light emitting device without the mixing agent is provided.

In accordance with an additional aspect, a system comprising a power source and at least one light emitting device electrically coupled to the power source is provided. In certain examples, the at least one light emitting device comprises a mixing agent separate from an emissive material and between a pair of electrodes, the mixing agent having an effective thickness to mix exciton precursor states to increase a fraction of excitons which are formed as a singlet state in the emissive material. In certain examples, the at least one light emitting device may be configured to operate at a current provided by the power source that is at least about 10% less than a current needed to operate a light emitting device without the mixing agent.

In accordance with another aspect, a device comprising a mixing agent, a host material and a phosphorescent material is disclosed. In certain examples, the device may be constructed and arranged to increase the fraction of singlet excitons in the host material into which the phosphorescent material is doped. The increased fraction of excitons in the host material may be effective to increase the phosphorescence emission efficiency as compared to a similar device that lacks the mixing agent.

Additional features, aspects, examples and embodiments are possible and will be recognized by the person of ordinary skill in the art, given the benefit of this disclosure.

BRIEF DESCRIPTION OF THE FIGURES

Certain illustrative embodiments are described below with reference to the figures in which:

FIGS. 4A-4B are graphs depicting performance characteristic of a light emitting device; in accordance with certain examples;

Figure 1A:
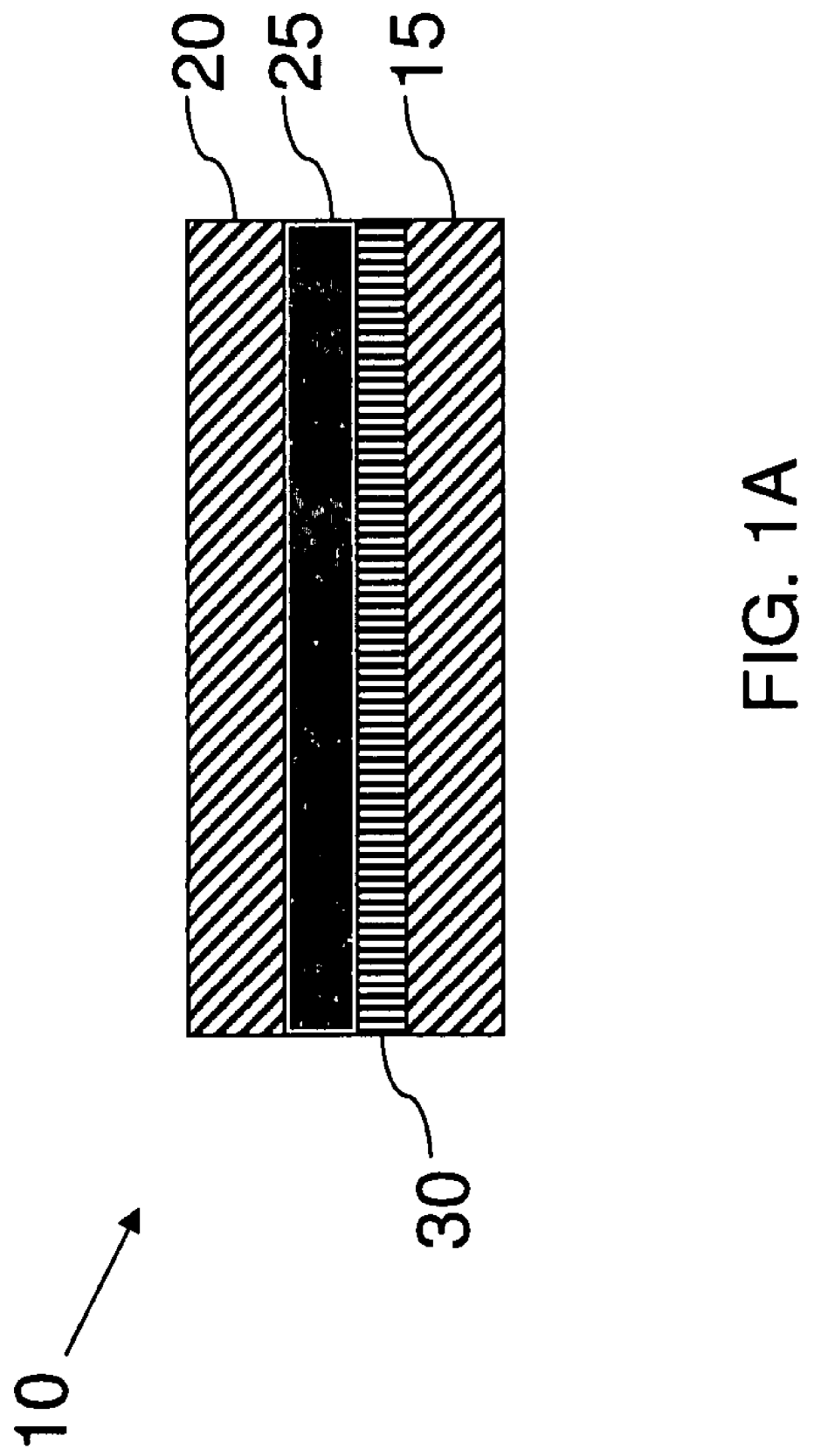
FIGS. 1A-1E are schematic drawings depicting several embodiments of a light emitting device, in accordance with certain examples.

It will be recognized by the person of ordinary skill in the art, given the benefit of this disclosure, that the dimensions of certain elements in the figures may have been enlarged, distorted or otherwise shown in a non-conventional manner to provide a more user-friendly description of the technology. In particular, the relative thicknesses of the different components in the light emitting devices should not be limited by the figures.

DETAILED DESCRIPTION

It will be recognized by the person of ordinary skill in the art, given the benefit of this disclosure, that certain embodiments of the devices disclosed herein provide highly efficient light emitting devices that may operate at lower currents (or voltages) and that have increased lifetimes. Certain embodiments provide certain advantages over devices based on sensitized fluorescence or phosphorescence including, but not limited to, the use of an emissive phosphor to facilitate energy transfer to a fluorescent emitter is not critical, a molecule that is both a strong mixer and a good emitter is not required, emission from long lived triplet states is not essential as in phosphorescence, and unstable molecules emitting in the UV are not required to provide blue light resulting from phosphorescence. Other features and advantages will be apparent to the person of ordinary skill in the art, in view of the technology described herein.

In accordance with certain examples, certain embodiments of the light-emitting devices disclosed herein may release photons in response to excitation of one or more components of the device. Emission can be stimulated by applying a voltage across a material, e.g., an electroluminescent material, within the device. Typically, the emission may occur by radiative recombination of an excited charge between layers of a device. Not all recombinations of charge in the device result in a desired light emission. Increasing the proportion of charge recombinations that result in a desired emission can increase the total device efficiency. The emitted light has an emission profile that includes a maximum emission wavelength and an emission intensity. The emission intensity can be measured in luminance (candelas/square meter (cd/m$^2$) or power flux (W/m$^2$)). The emission profile and other physical characteristics of the device may be altered by the electronic structure (e.g., energy gaps) of the materials used in the device. For example, the brightness, range(s) of color, efficiency, operating current (or voltage), and operating half-lives of light-emitting devices may vary based on the structure of the device and the properties of the materials in the device.

In accordance with certain examples, a light emitting device may include a first electrode, a second electrode, an emissive material between the first and second electrodes and a mixing agent separate from the emissive material. In certain examples, the mixing agent may be coupled to the emissive material in a manner to mix exciton precursor states to increase a fraction of excitons which are formed as a singlet state. In some examples, the mixing agent may be separate from, e.g., disposed as a layer adjacent to one (or both) of the first and second electrodes or otherwise disposed in a manner that separates the mixing agent from the emissive material. In other examples, one or more other materials, layers or molecules may be between the emissive material and the mixing agent. For example, the mixing agent may be separated from the emissive material by a spacing that is less than or equal to about one or two molecules. In embodiments where the mixing agent takes the form of a layer, the layer may have a suitable thickness and structure such that substantially no electrons or holes pass from the electrodes to the emissive material without traversing the mixing agent layer. This arrangement provides for effective mixing of the charge transfer states to form singlet state excitons. This arrangement of separating the mixing agent from the emissive material also reduces the likelihood that mixing of formed excitons in the emissive material occurs.

In accordance with certain examples, the mixing agent preferably has a suitable electronic structure such that the lowest energy level of the mixing agent is higher in energy than the lowest energy level of the emissive material. This property facilitates conversion of the maximum amount of excitons to a singlet state. In certain examples, the mixing agent may also be a good conductor of charge, whereas in other examples, the mixing agent may be non-conductive but may be disposed in a conductive host material. In certain embodiments, the mixing agent may be selected for its ability to selectively mix species. For example, it is desirable to promote mixing of charge transfer states but is not desirable to promote mixing of formed excitons. Without wishing to be bound by any particular scientific theory, an example of selective mixing includes mixing of an electron on one molecule and a hole on an adjacent molecule to form an exciton. When a voltage is applied to electrodes of the device, one electrode injects holes (positive charge carriers), while the other electrode injects electrons. The injected holes and electrons each migrate toward the oppositely charged electrode. When an electron and hole localize on the same molecule, an exciton is formed, which can recombine to emit light. While the mixing agent desirably mixes the exciton precursors to form singlet state excitons, once an exciton is formed, the mixing agent preferably does not substantially mix any formed excitons. By separating the mixing agent from the emissive material, substantial mixing of exciton precursors without substantial mixing of formed excitons may be accomplished. In addition, the fraction of excitons in singlet states may be maximized, which in turn, increases the efficiency of the light emitting device.

In accordance with certain examples and referring to FIG. 1A, a light emitting device 10 includes a first electrode 15, a second electrode 20, an emissive material 25 and a mixing agent disposed as a layer 30 between the first electrode 15 and the emissive material 25. While not shown, the mixing agent may be disposed between the second electrode 20 and the emissive material 25 instead of between the first electrode 15 and the emissive material 25. In certain examples, a mixing agent may be disposed between the first electrode 15 and the emissive material 25 and between the second electrode 20 and the emissive material 25. Suitable materials for the electrodes, emissive material and the mixing agent are discussed in more detail below. In operation of the device of FIG. 1A, the first electrode 15 may be biased by an energy source to provide electrons. Similarly, the second electrode 20 provides holes. The electrons and the holes may recombine on a single molecule of the emissive material 20 to form an exciton. Each exciton may take may one of four possible spin states: three 'triplet' states of total spin 1, or one 'singlet' state of total spin 0. In fluorescent light emitting devices, only the singlet spin state can produce light. Therefore, the fraction of excitons which form as singlets controls the device efficiency. By mixing charge transfer states, the fraction of excitons formed as singlet states may be increased, e.g., the mixing agent increases the fraction of excitons formed as a singlet state to greater than 25%, e.g., 35%, 40%, 45%, 50%, 55%, 60%, 65%, 70%, 75%, 80%, 85%, 90%, 95%, 99% or 100% of the total excitons formed. In some examples, the mixing agent mixes the charge transfer states without any substantial mixing of formed excitons, as mixing of formed excitons may lead to triplet formation and phosphorescence or non-radiative decay of the formed triplet states. In certain examples, the mixing agent of the device shown in FIG. 1A may be non-emissive such that substantially no light is emitted from the mixing agent at any wavelength. In other examples, the mixing agent may be emissive at certain wavelengths but is not emissive within an emission wavelength range of the emissive material.

In accordance with certain examples, the devices disclosed herein may include additional components than those shown in FIG. 1A. For example, the device may include a hole transport layer that that transports holes well but transports electrons poorly. The device may also include an electron transport layer (ETL) that transports electrons well but transports holes poorly. Positive and negative charges (holes and electrons, respectively) may be injected from the electrical contacts and forced to combine into excitons at the boundary between the HTL and ETL.

Figure 1B:
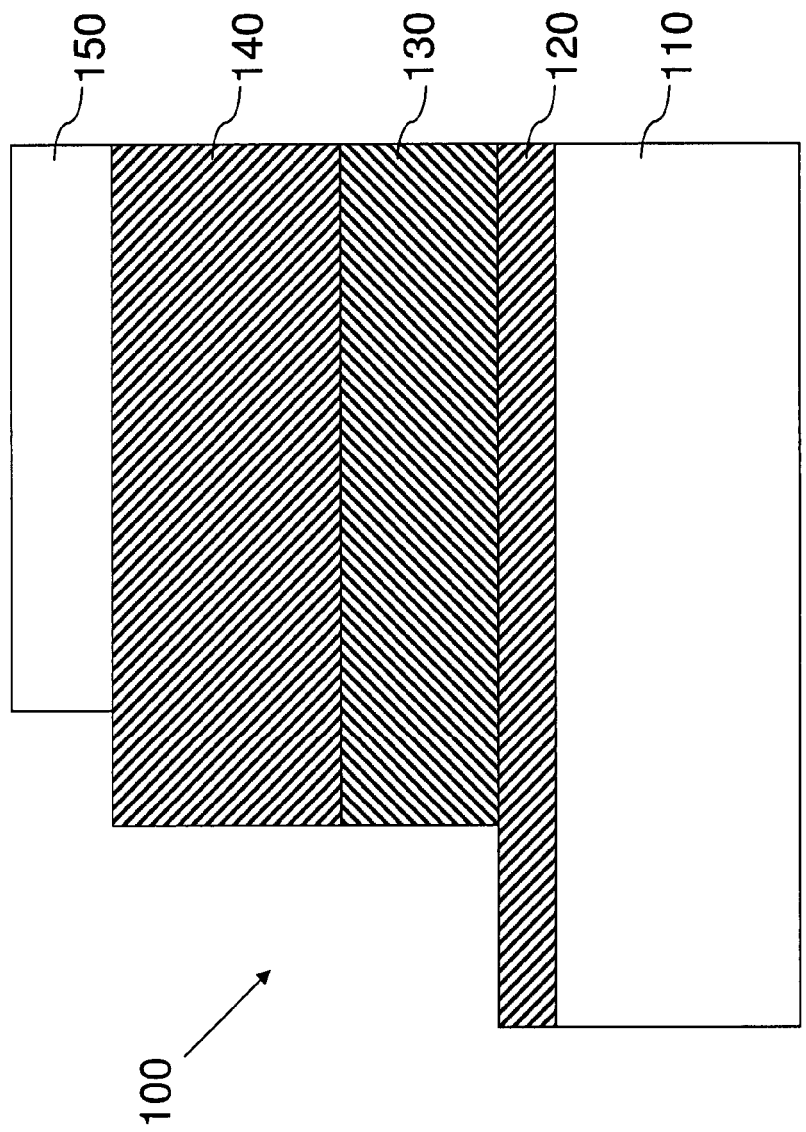
Figure 1C:
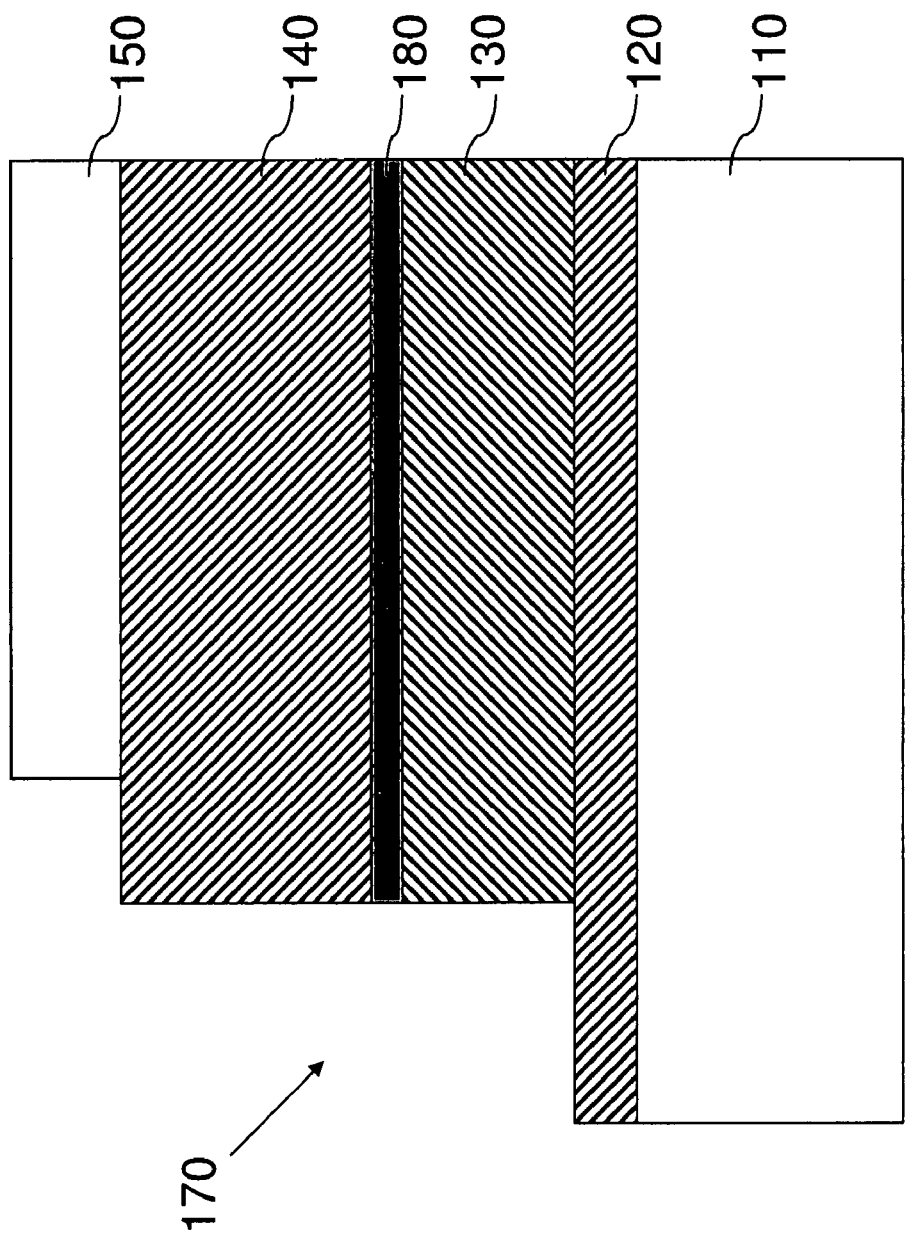

In accordance with certain examples, the light emitting devices may take various forms depending on the intended application of the light emitting device. In some examples, the components of the light emitting device may be disposed as individual layers on a substrate. For example and referring to FIG. 1B, a light emitting device 100 include a first electrode 120, a first layer 130 coupled to the first electrode 120, a second layer 140 coupled to the first layer 130, and a second electrode 150 coupled to the second layer 140. In certain examples, first layer 130 may be a hole transport layer and second layer 140 may be an electron transporting layer. In certain examples, one (or both) of the first layer 130 and the second layer 140 may include an emissive material. In the alternative, an emissive material may be disposed as separate layer (such as layer 180 in the light emitting device 170 of FIG. 1C) between the first layer 130 and the second layer 140. The layers may be disposed on a support or substrate 110. In some examples, the substrate may be removed post-deposition by suitable processes such as etching, grinding, blasting and the like, whereas in other examples, the substrate may remain part of the light emitting device.

Figure 1D:
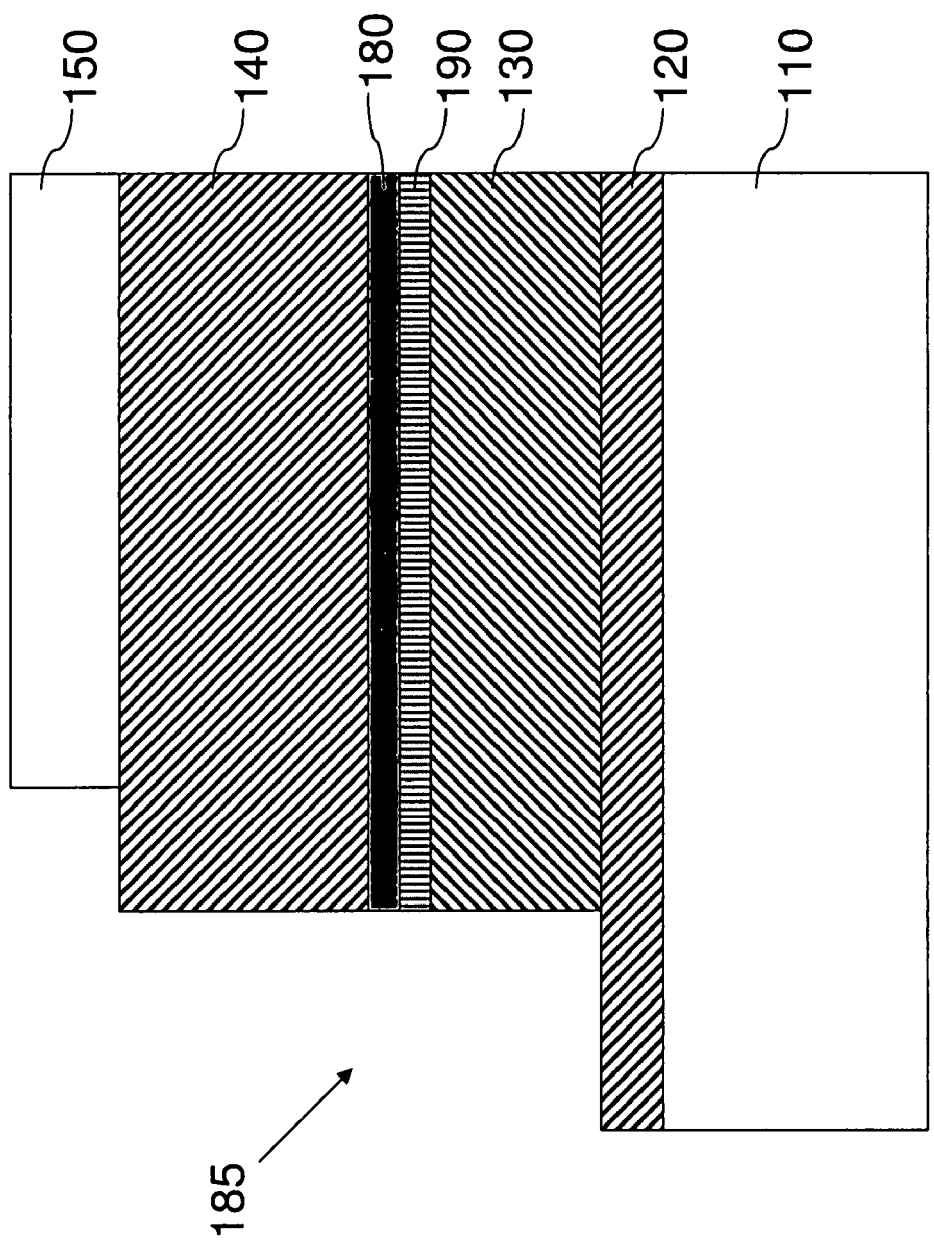
Figure 1E:
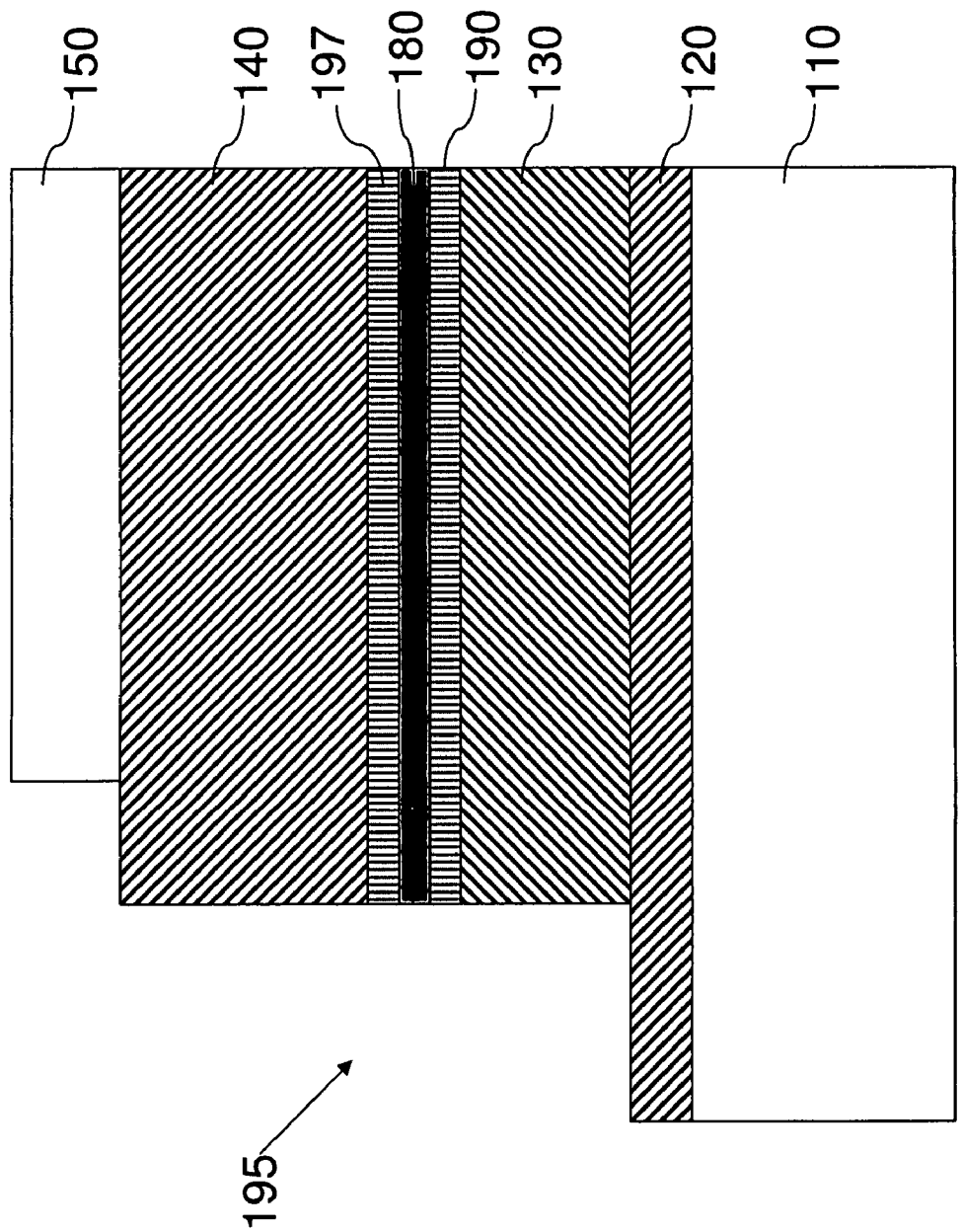

In certain embodiments, a mixing agent may be disposed as a layer adjacent to the emissive material. For example and referring to FIG. 1D, a light emitting device 185 is similar to that shown in FIG. 1C but comprises a mixing agent layer 190 between the first electrode 110 and the emissive material 170 is shown. In some examples, a light emitting device 195, which is similar to the light emitting device 185 but comprises two mixing agent layers 190 and 197 each of which abuts the emissive material 170, may be produced as shown in FIG. 1E. Additional configurations are possible and will be selected by the person of ordinary skill in the art, given the benefit of this disclosure. By disposing the mixing agent in a layer adjacent to the emissive material, the mixing agent is present where charge transfer states occur but is removed from the site of exciton formation in the emissive material. This configuration promotes singlet state exciton formation and reduces triplet formation in the emissive material.

As discussed above, the light emitting devices may operate by coupling the first electrode and the second electrode to a power source. A suitable voltage may be applied across the structure to provide light emission by the emissive material.

In examples where a mixing agent is used to promote an increase in the fraction of singlet state excitons, the current used to operate the device may be reduced by 10%, 25%, 50%, 75% or more as compared to the current used to operate a comparable device without the mixing agent. In some examples, the current may be at least 10% less, e.g., two- to four-fold less than a similar device that lacks the mixing agent. In the alternative, the current may be constant and more intense light may be emitted by light emitting devices that include a mixing agent. It will be recognized by the person of ordinary skill in the art, given the benefit of this disclosure, that voltage used to operate the device may also be reduced by a similar amount to the illustrative amounts disclosed above, e.g., a 25%, 50%, 75% or more reduction in voltage may be used.

In certain examples, the emissive material of the light emitting device is typically selected based on its fluorescence emission wavelength and, thus, the color emitted by the emissive material. In some examples, the light emitting device emits blue, green or red. Suitable emissive materials includes, but are not limited to, organic dyes, such as, 4-(dicyanomethylene)-2-methyl-6-(4-dimethylaminostyryl)-4H-pyran (DCM1) and DCM2 (purchased from Lambda-Physik and available from H. W. Sands), and other organic materials that are known to fluoresce. In some examples, the emissive material may be, for example, a polymer, such as a conjugated organic polymer or a polymer containing electroluminescent moieties or layers of organic molecules. In some examples, the exciton lifetime of the emissive material is preferably short, e.g., about 10 nanoseconds or less, such that the probability of triplet formation (or formation of species other than singlet state excitons) is reduced.

Figures 2A, 2B:
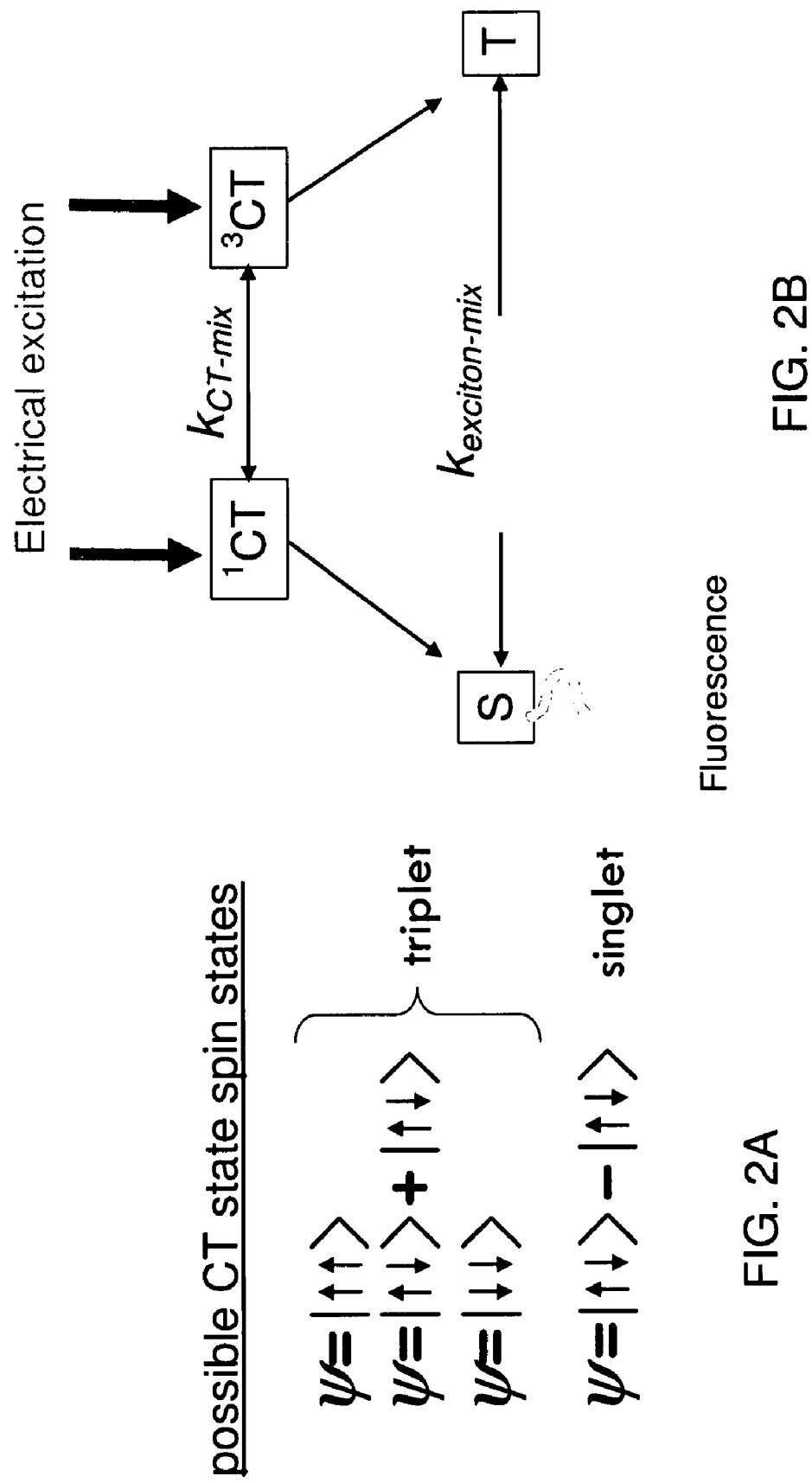
FIGS. 2A-2B schematically illustrate spin states and interconversions of spin states for charge-transfer and exciton states in a light emitting device, in accordance with certain examples.

In accordance with certain examples and as discussed above, a mixing agent may be effective to increase the fraction of singlet state excitons as described in the model shown in FIGS. 2A and 2B. In operation of the light emitting devices, a voltage may be applied across the electrodes and oppositely charged carriers (i.e., electrons and holes) may migrate from the electrodes to a recombination zone. At the recombination zone, the oppositely charged carriers can closely approach one another while remaining localized on different molecules—an arrangement referred to as a charge-transfer (CT) state. Depending on the alignment of spins, the CT state can be a singlet or triplet. As illustrated in FIG. 2A, four different spin alignments are possible for the CT state, three of which are triplets, and the other is a singlet. The singlet and triplet CT states ($1^{CT}$ and $3^{CT}$, respectively) may interconvert with rate $k_{CT-mix}$. The separated charges of the CT state may become localized on a single molecule to form an exciton. Like the CT state, the exciton may be a singlet (S) or triplet (T). When a singlet exciton occurs on an emissive molecule, emission of a desired wavelength of light by fluorescence may occur when the exciton returns to a ground state, as shown in FIG. 2B. The exciton singlet and triplet states can also interconvert, with rate $k_{exciton-mix}$. The fraction of recombinations that results in light emission is related, in part, to the rates $k_{CT-mix}$ and $k_{exciton-mix}$ and the rate of singlet exciton decay. These rates can be influenced by the choice and location of materials used in the device.

In certain embodiments disclosed herein, the mixing agent is effective to increase the rate $k_{CT-mix}$ when the light emitting device includes a mixing agent. A mixing agent preferably has strong spin-orbit coupling and a wide energy gap between a highest occupied molecular orbital (HOMO) and a lowest unoccupied molecular orbital (LUMO). The mixing agent may be advantageously located separate but proximate to an emissive molecule in a device to promote mixing of charge transfer states without substantial mixing of formed excitons. For example, the mixing agent may be deposited in a layer adjacent to a layer including the emissive molecule.

In accordance with certain examples, spin-orbit coupling increases as the fourth power of atomic number, or as $Z^4$. As such, compounds that include an atom with high atomic number may be used as mixing agents. Materials that include atoms with an atomic number of 19 or higher, 21 or higher, 31 or higher, 37 or higher, 39 or higher, 49 or higher, 55 or higher, 71 or higher, 81 or higher, or 89 or higher may exhibit sufficient spin-orbit coupling to be useful as (or in) mixing agents. Complexes of second row or third row transition metals (including organometallic complexes) may be useful as mixing agents. For example, an iridium (Z=77) complex may be suitable. One useful iridium complex includes iridium(III) bis[(4,6-difluorophenyl)-pyridinato-N,C2] picolinate (FIrpic). Other transition metals particularly suitable for use in mixing agents include, but are not limited to, rhenium, ruthenium, palladium, rhodium, copper or rare earth elements. The transition metal may be used alone or with one or more other transition metals, e.g., two or more transition metal complexes may be present as mixing agents. In some examples, the transition metal may be complexed such that ligands of the complex buffer the transition metal from adjacent molecules. Such buffering may reduce the number of triplet excitons that are formed. For example, it may be desirable for a heavy atom (such as a transition metal atom) in a mixing agent to be protected by one or more ligands. The ligands can serve to distance the heavy atom (or atoms) from neighboring molecules, among other functions. The ligands may preferably extend outwardly from the heavy atom (or atoms) in all three dimensions, giving the spin mixing agent a generally spherical or ellipsoid shape. Some metal complexes have a generally flat shape, such as, for example, square planar complexes with aromatic ligands, some tetrapyrrole ligands (e.g., a porphyrin), or some octahedral complexes where the axial ligands extend only a short distance from a heavy atom compared to the equatorial ligands. Such flat complexes may be less desirable as mixing agents compared to corresponding complexes with a more spherical or ellipsoid shape. Whatever the general shape of the mixing agent, the ligands may provide steric bulk to restrict the close approach of a metal atom to other molecules.

In certain examples, the mixing agent may be non-emissive such that substantially no light is emitted from it. The mixing agent need not be emissive, because it is not involved in energy transfer to an emissive molecule. For other uses of mixing agents, such as where the mixing agent is directly emissive, or where the mixing agent facilitates energy transfer from one material to another, the mixing agent must be emissive. In addition, using a mixing agent to facilitate energy transfer from one material to another imposes significant design constraints: a high energy material is desirably the site of exciton formation, a low energy material is desirably the site of light emission, and mixing agent desirably has an intermediate energy in order to facilitate energy transfer and enhance spin mixing. These constraints can be difficult to meet, especially if high energy (i.e., blue) light emission is desired, in which case the other two materials should be very high energy and emissive. Preferably, a mixing agent increases the rate $k_{CT-mix}$ without substantially increasing $k_{exciton-mix}$. By separating the mixing agent from the emissive material, it is possible to increase $k_{CT-mix}$ and reduce $k_{exciton-mix}$.

In accordance with certain examples, the electrodes may include a suitable conductive material to provide electrons or holes. In some examples, the first electrode may be, for example, a high work function hole-injecting conductor, such as an indium tin oxide (ITO) layer. Other materials suitable for use in the first electrode include, but are not limited to, gallium, zinc indium tin oxide, titanium nitride, and conductive polymers such as polyaniline and the like. Illustrative materials for use in the second electrode include, but are not limited to, a material having a low work function (e.g., less than 4.0 eV), electron-injecting materials, metals such as aluminum, barium, ytterbium, calcium, a lithium-aluminum alloy (Li:Al), or a magnesium-silver alloy (Mg:Ag). In certain examples, one or both of the electrodes, e.g., the second electrode such as Mg:Ag electrode, may be covered with an opaque protective metal layer. For example, a layer of silver for protecting the cathode layer from atmospheric oxidation, or a relatively thin layer of substantially transparent ITO.

In certain examples, the substrate of the light emitting device may be opaque or transparent. The substrate can be rigid or flexible. The substrate can be plastic, metal or glass. In some examples, the surface of the substrate may be roughened or treated prior to deposition of any other layers. For example, the substrate may be blasted, etched, sintered, roughened or otherwise treated in some manner prior to deposition of any other components of the light emitting device. In some examples, the substrate may remain on the device after the components of the device are formed, whereas in other examples, the substrate may be removed prior to use of the light emitting device. Suitable methods of removal include, but are not limited to, polishing, grinding, etching, sanding, thermal decomposition and the like. It will be within the ability of the person of ordinary skill in the art, given the benefit of this disclosure, to select suitable methods to remove the substrate.

In accordance with certain examples, the electron transport layer (ETL) may be a molecular matrix. In certain examples, the molecular matrix may be non-polymeric. In some examples, the molecular matrix may include a small molecule such as a metal complex. For example, the metal complex can be a metal complex of 8-hydroxyquinoline. In certain examples, the metal complex of 8-hydroxyquinoline may be an aluminum, gallium, indium, zinc or magnesium complex, e.g., aluminum tris(8-hydroxyquinoline) ($AlQ_3$). Other suitable materials for use in the ETL can include, but are not limited to, metal thioxinoid compounds, oxadiazole metal chelates, triazoles, sexithiophene derivatives, pyrazine, and styrylanthracene derivatives. These illustrative material may be used alone or in combination with any one or more other materials. The person of ordinary skill in the art, given the benefit of this disclosure, will be able to select suitable material for use in electron transport layers In accordance with certain examples, the hole transport layer (HTL) may include an organic chromophore. The organic chromophore may be a phenyl amine, such as, for example, N,N'-diphenyl-N,N'-bis(3-methylphenyl)-(1,1'-biphenyl)-4,4'-diamine (TPD) or other suitable phenyl amines. The HTL may include a polyaniline, a polypyrrole, a poly (phenylene vinylene), copper phthalocyanine, an aromatic tertiary amine or polynuclear aromatic tertiary amine, a 4,4'-bis(9-carbazolyl)-1,1'-biphenyl compound, or an N,N,N',N'-tetraarylbenzidine. Additional suitable materials for use in a hole transport layer will be readily selected by the person of ordinary skill in the art, given the benefit of this disclosure.

In accordance with certain examples, the exact thickness of each of the layers may vary depending, for example, on the desired properties of the device and/or its intended use. The first electrode may have a thickness of about 500 Angstroms to about 4000 Angstroms. The first layer may have a thickness of about 50 Angstroms to about 1000 Angstroms. The second layer may have a thickness of about 50 Angstroms to about 1000 Angstroms. The second electrode can have a thickness of about 50 Angstroms to greater than about 1000 Angstroms. In examples where the mixing agent is deposited as a layer, the mixing agent layer is of a suitable thickness such that the electrons or holes must traverse it prior to the emissive material. Illustrative thicknesses for the mixing agent layer include, but are not limited to, about 70 Angstroms to about 1000 Angstroms.

In accordance with certain examples, other multilayer structures may be used to improve the light emitting device performance or to alter the properties of the light emitting device. In certain examples, a blocking layer, such as an electron blocking layer (EBL), a hole blocking layer (HBL) or a hole and electron blocking layer, may be included in the device. Some examples of materials useful in a hole blocking layer or an electron blocking layer include, but are not limited to, 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino}triphenylamine (m-MTDATA), poly-ethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino) phenyl-1,3,4-oxadiazol-2-yl)benzene, or 1,3,5-tris[5-(4-(1,1-dimethylethyl)phenyl)-1,3,4-oxadiazol-2-yl]benzene.

In accordance with certain examples, various methods may be used to produce the light emitting devices. In some examples, each of the layers may be produced using spin coating, spray coating, dip coating, vapor deposition, layer-by-layer processing, or other thin film deposition methods. The electrodes may each be sandwiched, sputtered, or evaporated onto the exposed surface of another layer or the substrate. One or both of the electrodes may be patterned. The electrodes of the device may be coupled to am energy source, e.g., a voltage source, by one or more interconnects or electrically conductive pathways. Upon application of the voltage, light is generated from the device. The device may be produced in a controlled (oxygen-free and moisture-free) environment to reduce or prevent quenching of luminescent efficiency during the fabrication process. In the alternative, the device may be exposed to an inert gas, such as argon or nitrogen, to drive away any oxygen molecules. In some examples, the device may be placed in a sealed housing, optionally containing an inert gas, to prevent oxygen or other molecules from reducing the efficiency of the device.

In accordance with certain examples, a device comprising a mixing agent, a host material and a phosphorescent material is disclosed. In some examples, the device may also include first and second electrodes as described herein. In other examples, the device may include an electron transport layer, a hole transport layer or both. The device may be constructed and arranged similar to any of the devices disclosed herein. For example, the device may include a first electrode and a second electrode with a host material doped with the phosphorescent material between the first and second electrodes. In certain examples, the device may be constructed and arranged to increase the fraction of singlet excitons in the host material into which the phosphorescent material is doped. By increasing the fraction of singlet excitons in the host material, the efficiency of phosphorescence emission may also be increased providing a more efficient light emitting device as compared to a similar device that lacks the mixing agent. Suitable host materials include, but are not limited to, CBP, TPD, 1,3-bis(9-carbazolyl)benzene (mCP), 4,4,4-tri(N-carbazolyl) triphenylamine (TCTA), BAlq$_3$, and Alq$_3$. Illustrative phosphorescent materials include, but are not limited to, PtOEP, Ir(ppy)3, FIrpic, FIr6, btpIr, btIr, and Ir(piq)2(acac). The mixing agent may be any one or more mixing agent disclosed herein. In addition, other suitable host materials, phosphorescent materials and mixing agents will be selected by the person of ordinary skill in the art, given the benefit of this disclosure.

In accordance with certain examples, the devices disclosed herein may be used to improve the efficiency of a deeply-saturated dye. For example, by including a mixing agent in a device that includes a deeply-saturated dye, the efficiency of the dye may be comparable to those of phosphors. For a display to be able to produce the full color spectrum, the display preferably includes a red dye, green dye and blue dye. Each of these dyes desirably produces a color that is highly saturated as a low saturation may prevent display of the full color spectrum. By using a mixing agent in combination with one or more of a red dye, a green dye or a blue dye, the efficiency of each of the dyes may be increased to provide for more saturated colors and to produce colors more faithfully.

The following examples serve to illustrate some of the novel features, aspect and examples of the technology disclosed herein and should not be construed as limiting the scope of the appended claims.

Example 1

Figure 3B:
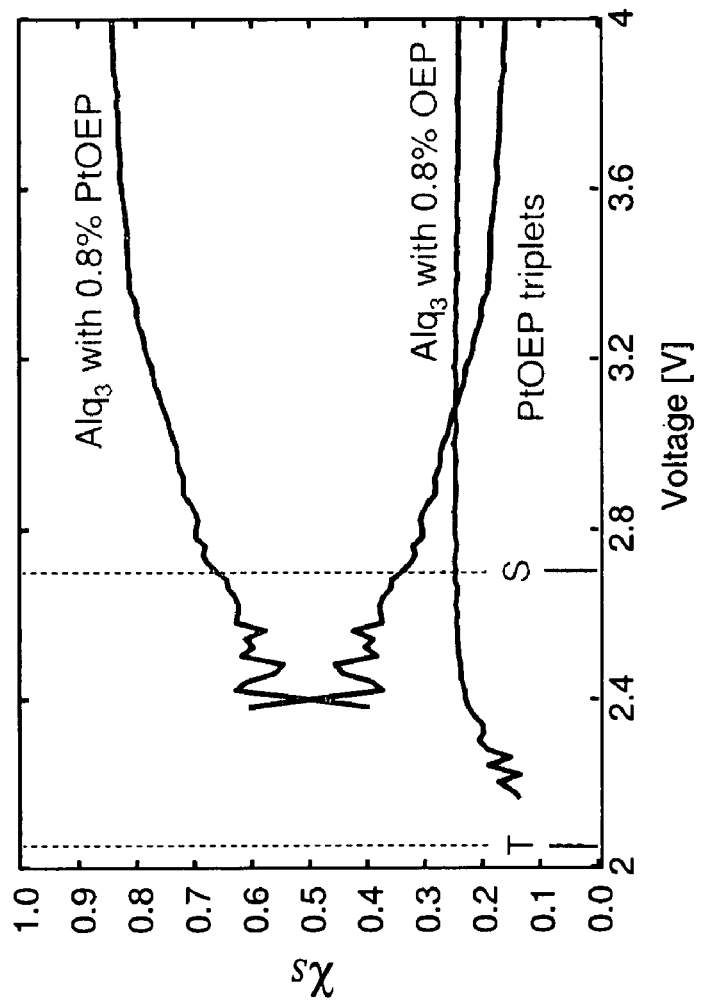
FIG. 3B is a graph depicting performance characteristics of the device of FIG. 3A, in accordance with certain examples.
Figure 3A:
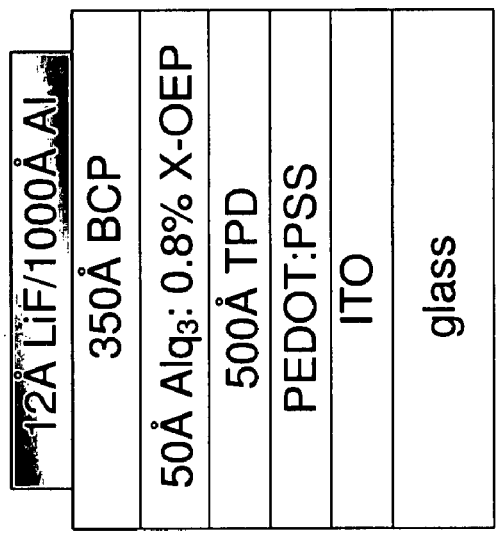
FIG. 3A is schematic drawing depicting a light emitting device.

FIG. 3A schematically illustrates the structure of a light emitting device that was produced. The device was made by thermally evaporating layers of organic materials onto a substrate of glass coated with indium tin oxide (ITO). A layer of poly(3,4-ethylenedioxythiophene): poly(4-styrenesulfonate) (PEDOT:PSS) was applied over an ITO electrode. A 500 Angstrom thick layer of TPD was next applied, followed by a 50 Angstrom thick layer of the emissive material AlQ$_3$ mixed with 0.8% of either octaethyl porphyrin (OEP) or platinum octaethyl porphyrin (PtOEP), and a 350 Angstrom thick layer of bathocuproine (BCP) as an electron transporting layer. An electrode (12 Å LiF/1000 Å Al) completed the device.

FIG. 3B depicts the fraction of singlet excitons (of total excitons) generated on AlQ$_3$ as a function of applied voltage. The singlet fraction was calculated by two self-consistent methods: first, by considering the ratio of electroluminescence (EL) to photoluminescence (PL) (assuming that neat AlQ$_3$ has singlet fraction $\chi_S$ of 0.25 or 25%), and secondly, by comparing the voltage dependence of AlQ$_3$ fluorescence (corresponding to singlets) to PtOEP phosphorescence (corresponding to triplets). Including PtOEP increased the value of $\chi_S$ compared to when OEP was included.

FIGS. 4A-4B compare external quantum efficiency and photoluminescence spectra for devices including 0.8% PtOEP in the AlQ$_3$ layer or without PtOEP. Including PtOEP reduced the external quantum efficiency by approximately two-fold. However, the reduction in external quantum efficiency was less than the reduction in photoluminescence. Because AlQ$_3$ and PtOEP have similar photoluminescence efficiencies, this result indicates that PtOEP enhances both precursor mixing ($k_{CT-mix}$) and intersystem crossing ($k_{exciton-mix}$) in AlQ$_3$.

Example 2

Figure 5B:
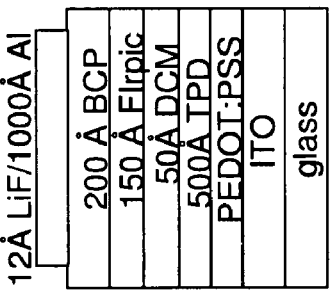
FIGS. 5A-5D are schematic drawing depicting light emitting devices and energy profiles of the devices, in accordance with certain examples.
Figure 5D:
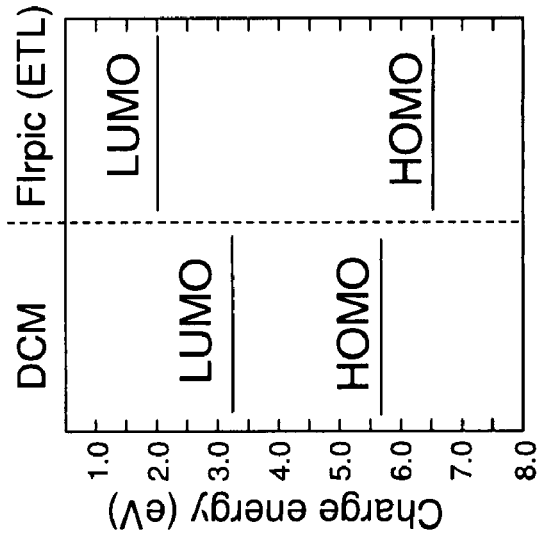
Figure 5A:
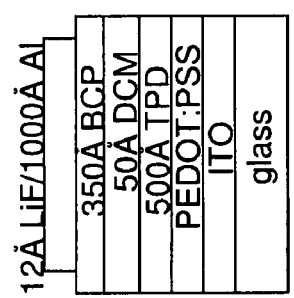

FIGS. 5A-5B schematically illustrate the structures of two light emitting devices, including the materials and thicknesses used. The devices were made by thermally evaporating layers of organic materials onto a substrate of glass coated with ITO. In the first device (FIG. 5A), a layer of PEDOT:PSS was applied over an ITO electrode. A 500 Angstroms thick layer of TPD was next applied, followed by a 50 Angstroms thick layer of the emissive material DCM1, and a 350 Angstroms thick layer of BCP as an electron transport layer. An electrode (12 Angstroms LiF/1000 Angstroms Al) completed the device.

In this first device, the charge transfer (CT) state involved an electron on BCP and a hole on DCM. This CT state relaxed into an exciton on DCM, so that light was produced by DCM excitons. In the second device (FIG. 5B), the electron transporting layer was made of a 200 Angstrom thick layer of BCP (adjacent to the electrode) and a 150 Angstrom thick layer of FIrpic (adjacent to the DCM layer), The total thickness of the electron transporting layer, 350 Angstroms, was the same as in the first device. All other device parameters were the same. The heavy iridium atom (Z=77) in FIrpic gives rise to strong spin-orbit coupling. In the second device, the CT state consists of an electron on FIrpic and a hole on DCM. This CT state also relaxed into an exciton on DCM.

Figure 5C:
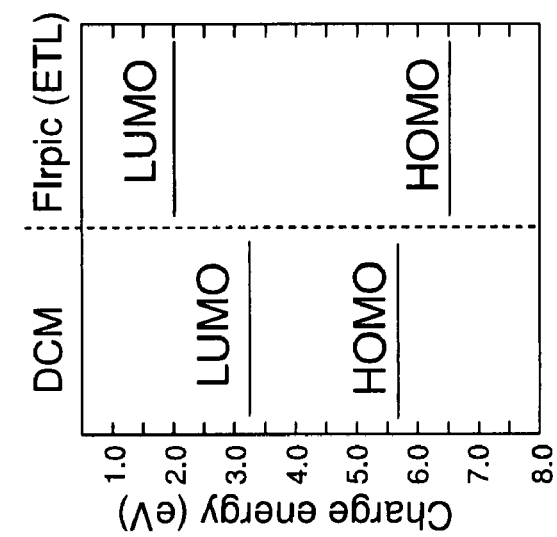
Figure 6:
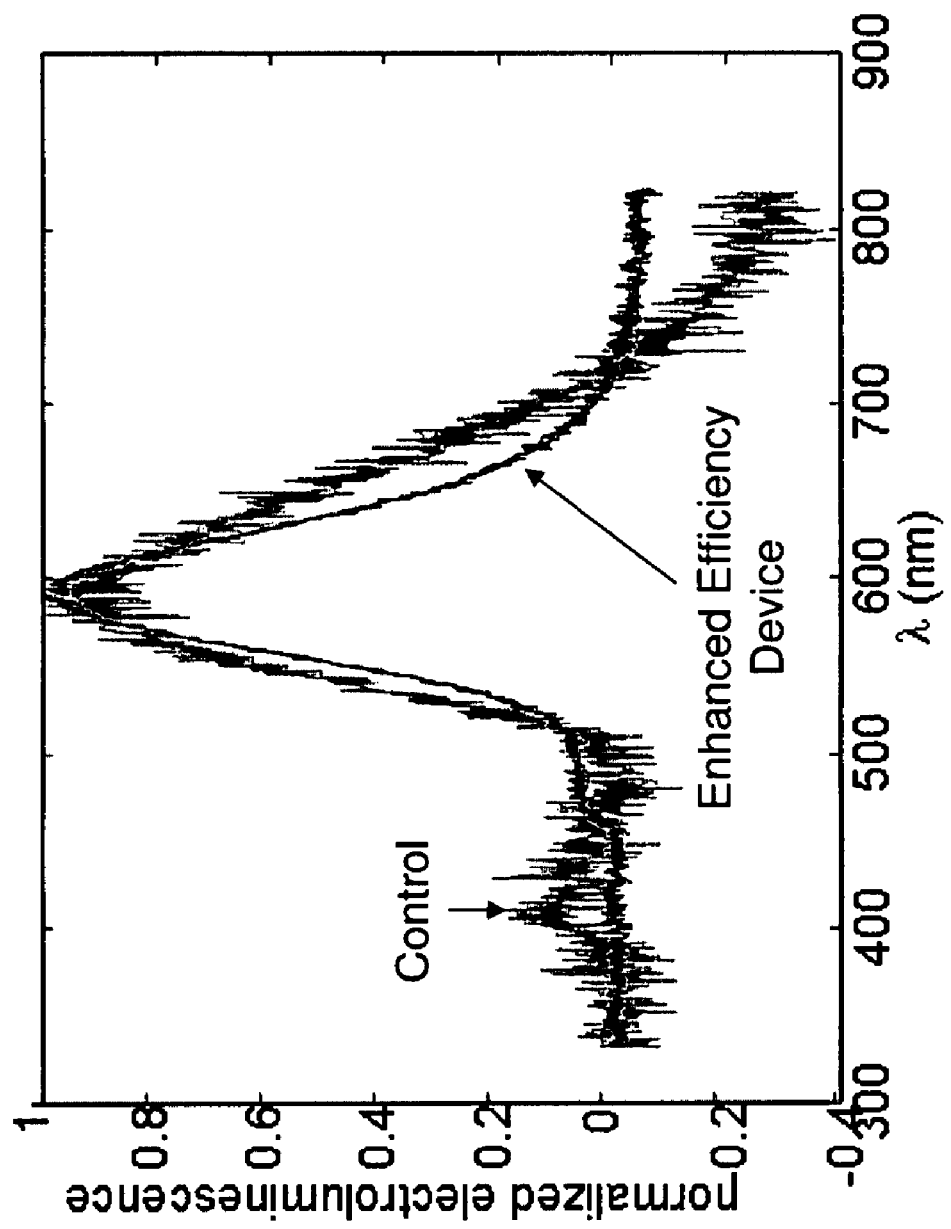
FIG. 6 is a graph depicting performance characteristics of a light emitting device, in accordance with certain examples.

FIG. 5C and FIG. 5D illustrate the energy level structure of exciton formation interface in the device of FIG. 5A and FIG. 5B, respectively. The two energy level structures are similar: for both devices the HOMO and LUMO energy levels of the emissive material lie within the HOMO-LUMO gap of the electron transport material. FIG. 6 shows the luminescent spectra recorded from the FIG. 5A device (light trace labeled "control") and from the FIG. 5B device (dark trace labeled "enhanced efficiency device"). Both spectra show an emission maximum at 590 nm, indicating that both devices were emitting light from excitons formed in DCM.

Figure 7:
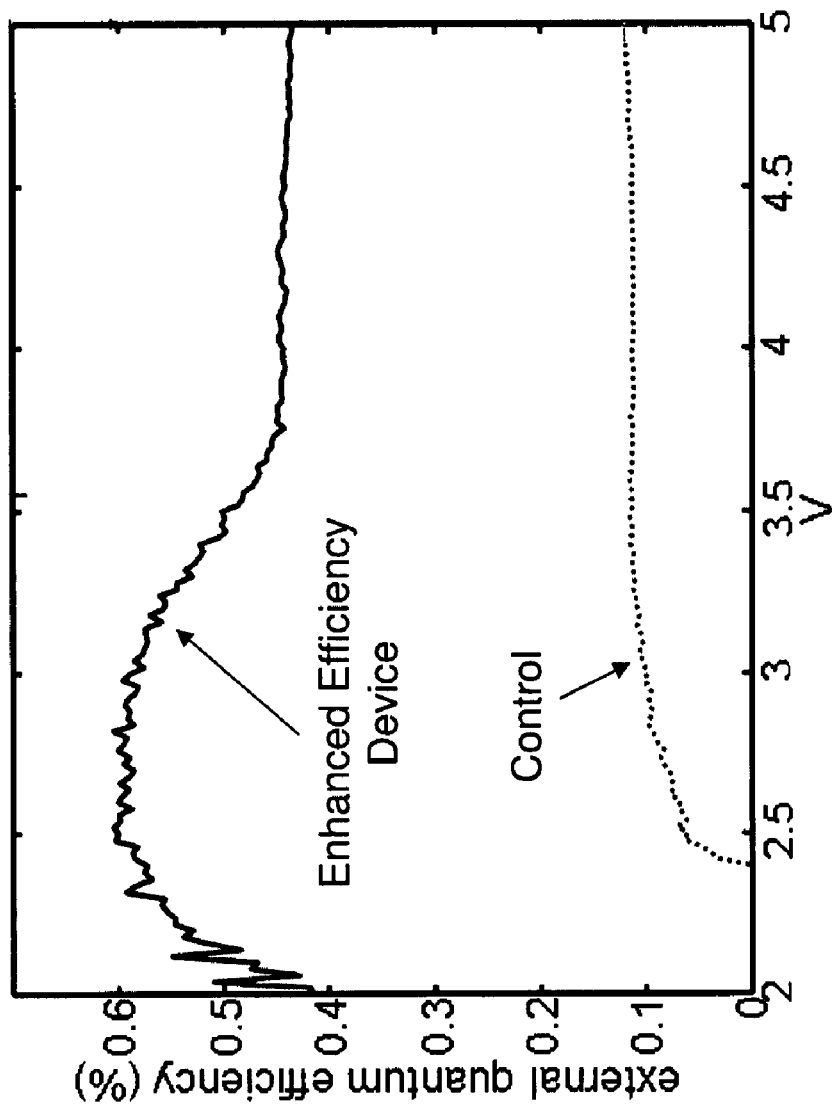
FIG. 7 is a graph depicting performance characteristics of a light emitting device, in accordance with certain examples.

FIG. 7 shows the external quantum efficiencies (the ratio of photons emitted from the device to the electrons fed into the device) measured as a function of voltage for both devices. Efficiency in the device which included a mixing agent was approximately four times greater than in the control device over the applied voltage range (2-5 Volts)

Example 3

Light emitting devices were fabricated on cleaned and ultraviolet-ozone-treated glass substrates pre-coated with an indium tin oxide anode with a sheet resistance of about 20 Ohms per square. To enhance hole injection from the anode, all devices used a thin layer of poly(3,4-ethylenedioxythiophene):poly(4-styrenesulphonate) (PEDOT:PSS). This layer was prepared by spin coating onto the indium tin oxide substrate followed by baking at a temperature of about 115° C. for at least 30 minutes in an oxygen-free environment. Subsequent layers were deposited by thermal evaporation at pressures less than $3\times10^{-6}$ Torr. The cathode consisted of 12 Angstroms of LiF followed by 1,000 Angstroms of Aluminum. All calculations discussed below were carried out with NWChem (Kendall, R. A. et al. Comput. Phys. Commun. 128, 260 (2000). 89; Straatsma, T. P. et al. NWChem (Pacific Northwest National Laboratory, Richland, 2004) using B3LYP (Becke, A. D. J. Chem. Phys. 98, 5648 (1993). For δ-AlQ$_3$, the neutral geometry was optimized in the 3-21basis and the constrained single-point calculations used 6-31*. For α-AlQ$_3$ and FIrpic/DCM2, the constrained-state geometries were optimized in the 3-21basis, whereas a 6-31basis was used to compute the CT-state singlet-triplet gap in α-AlQ$_3$.

Figure 8:
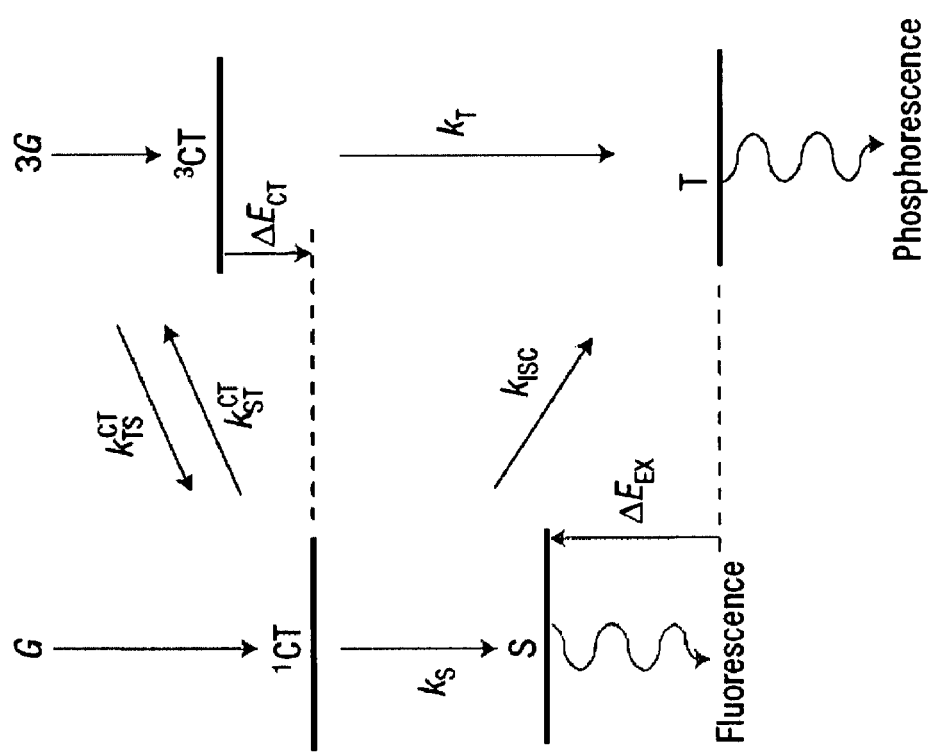
FIG. 8 is a rate model for exciton formation, in accordance with certain examples.

FIG. 8 shows a rate model for exciton formation that was used in the calculations. Referring to FIG. 8, singlet (S) and triplet (T) excitons are formed from singlet ($^1$CT) and triplet ($^3$CT) CT states with rates $k_S$ and $k_T$. The model allows for a splitting $\Delta E_{CT}$ between $^1$CT and $^3$CT, and thus defines independent rates for mixing $^1$CT into $^3$CT ($k^{CT}_{ST}$) and mixing $^3$CT into $^1$CT ($k^{CT}_{TS}$). Singlet excitons are mixed into triplet excitons with a rate $k_{ISC}$. The reverse process is ignored owing to the large exciton exchange splitting $\Delta E_{EX}$. Triplet CT states are formed at three times the rate of formation of singlet CT states. This model is based on the assumption that exciton formation follows the relaxation of a charge-transfer (CT) state consisting of an electron and a hole on neighboring molecules. Like excitons, CT states have either singlet or triplet symmetry, and form excitons with the same spin symmetry: singlet excitons are formed from singlet CT states with rate $k_S$, and triplet excitons from triplet CT states with rate $k_T$. Since charges injected into a light emitting device are uncorrelated, triplet CT states form at a rate $G_T$ three times larger than the singlet CT formation rate $G_S$. Therefore, in the absence of processes which can convert, or mix, a singlet CT state to a triplet CT state or vice versa, the fraction $\chi_S$ of excitons which form as singlets will be fixed at 0.25, and 75% of the input energy will be wasted in triplet states.

If, however, the CT mixing rates $k^{CT}_{ST}$ and $k^{CT}_{TS}$ are comparable to or larger than $k_S$ or $k_T$, then $\chi_S$ will vary as a function of $k_S$ and $k_T$ and will not in general be limited to $\chi_S$=0.25. The rate of singlet-triplet mixing is governed by the strength of the coupling between singlet and triplet states, which is typically $10^{-4}$-$10^{-5}$ eV in purely organic systems owing to weak spin-orbit and spin-lattice interactions. If the singlet and triplet states are degenerate, this leads to a predicted mixing rate of $k_{ST}$ about $10^8$ s$^{-1}$. An appreciable energy gap between the two states will significantly slow mixing rates. The energetic splitting of the CT states is therefore central to device efficiency.

This examples describes the energetics of the CT states in the archetypal small molecule tris(8-hydroxyquinoline) aluminum (AlQ$_3$) using density functional theory. The structure of a neutral, isolated AlQ$_3$ dimer taken from the δ-AlQ$_3$ crystal structure was first optimized. Constrained density functional theory calculations on the AlQ$_3^{+, \uparrow}$/AlQ$_3^{-, \downarrow}$ and AlQ$_3^{+, \uparrow}$/AlQ$_3^{-, \uparrow}$ configurations were performed, from which a singlet-triplet gap $\Delta E_{CT}$=−70 meV was obtained indicating that the singlet lies significantly below the triplet. A similar calculation on α-AlQ$_3$ places the singlet 25 meV below the triplet. It has previously been shown that this technique accurately predicts the energies of both spin and CT states, which provides confidence in the accuracy of this prediction (See Rudra, I., Wu, Q. & Van Voorhis, T. J. Chem. Phys. 124, 024103 (2006); Wu, Q. & Van Voorhis, T. Phys. Rev. A 72, 024502 (2005); Wu, Q. & Van Voorhis, T. J. Chem. Theory Comput. 2, 765 (2006)).

For more distant AlQ$_3$ pairs (for example next-nearest neighbors) $\Delta E_{CT}$ should decay exponentially, rapidly becoming unimportant. The larger than expected CT singlet-triplet gap indicates that the CT mixing in AlQ$_3$ is probably slow, forcing $\chi_S$=0.25. In addition, the calculated energetic ordering of the singlet and triplet CT states is opposite to the exciton ordering, contrary to the usual assumption.

Example 4

Figure 9A:
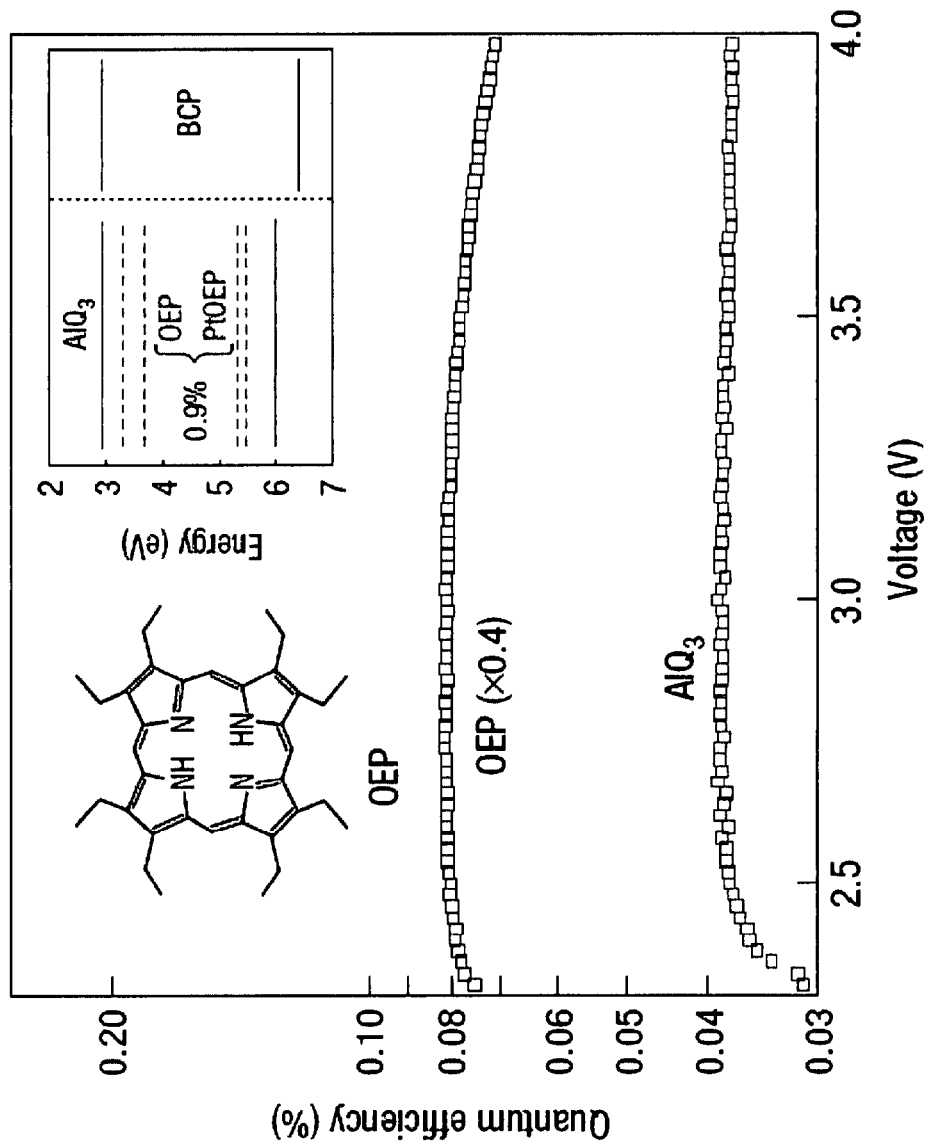
FIGS. 9A and 9B are graphs of quantum efficiency versus voltage for a light emitting device, in accordance with certain examples.

Since CT states are typically non-degenerate in AlQ$_3$, $\chi_S$ may be expected to vary only if the mixing interaction is artificially enhanced. The insert of FIG. 9A shows the energy structure of a light emitting device used to investigate the effect of spin mixing on the singlet exciton fraction. The emissive layer in this device consisted of AlQ$_3$ doped with either the platinum-containing molecule platinum octaethylporphin (PtOEP) or its Pt-free analogue, octaethylporphin (OEP). PtOEP introduces strong spin-orbit coupling into the system, mixing both CT and exciton states. The OEP control allows for the isolation of the spin-orbit coupling effect. In addition, PtOEP captures triplet excitons formed in the AlQ$_3$ host, allowing for the monitoring of the triplet population within AlQ$_3$ and the measurement of $\chi_S$. PtOEP will also capture some singlet excitons from AlQ$_3$. The thicknesses of the TPD, BCP and emissive layers are 500, 350 and 50 Angstroms, respectively.

In both OEP and PtOEP devices, the molar concentration of the porphyrin is 0.9%, below the requirement for complete Förster transfer of singlet excitons, ensuring that some AlQ$_3$ fluorescence can be observed. The singlet- and triplet-exciton populations in the emissive layer are thus reflected in AlQ$_3$ fluorescence and PtOEP phosphorescence, whose efficiencies may be described generally by the respective equations $$\eta^{EL}_{AlQ3}=\eta^{PL}_{AlQ3}[(1-d_{EL})(1-r_S)\chi_S] \qquad (1)$$

$$\eta^{EL}_{PtOEP}=\eta^{PL}_{PtOEP}[(1-d_{EL})[(1-\chi_S)r_T+r_S\chi_S]+d_{EL}] \qquad (2)$$

Here $\eta^{PL}_{AlQ3}$ and $\eta^{PL}_{PtOEP}$ are the PL efficiencies of AlQ$_3$ and PtOEP, respectively, $r_S$ and $r_T$ are the fractions of singlet and triplet excitons, respectively, that are transferred to the porphyrin from AlQ$_3$ and $d_{EL}$ is the fraction of all electrically excited excitons that form on PtOEP rather than on AlQ$_3$. The flat efficiency of AlQ$_3$ for 2.5<V<4V in the presence of OEP in FIG. 9A demonstrates that $r_S$ and $d_{EL}$ in AlQ$_3$ doped with a porphyrin are independent of voltage. In contrast, the quantum efficiency of AlQ$_3$ is voltage dependent for 2.5<V<4V when Pt is introduced via PtOEP, suggesting that $\chi_S$ is changing. To confirm this, the $r_S$ and $d_{EL}$ contributions were removed from the PtOEP emission using a PL measurement of a thin film of 0.9% PtOEP:AlQ$_3$ with a wavelength l=408 nm pump. The ratio of PtOEP PL to AlQ$_3$ PL is defined as f. It is related to $d_{PL}$ and $r_S$ as $f=[(1-d_{PL})r_S+d_{PL}]\eta^{PL}_{PtOEP}/[(1-r_S)(1-d_{PL})\eta^{PL}_{AlQ3}]=(0.5\pm0.1)$, where $d_{PL}$ is the fraction of all optically excited excitons that form on PtOEP rather than on AlQ$_3$. Then defining $P=\log(\eta^{EL}_{PtOEP}$-f $\eta^{EL}_{AlQ3})$ and $F=\log(\eta^{EL}_{AlQ3})$ gives $$\chi_S = -\frac{A\dfrac{dP}{dF}}{1-\dfrac{dP}{dF}} \qquad (3)$$

where $A=[r_T+d_{EL}/(1-d_{EL})]/[r_T+d_{PL}/(1-d_{PL})]$. From the respective absorption strengths of AlQ$_3$ and PtOEP at the pump wavelength, $d_{PL}$ was calculated to be about 6%. Thus, the triplet transfer efficiency, $r_T$, which is approximately unity, dominates the denominator in the expression for A. It follows that A is greater than about 1 regardless of $d_{EL}$, which is in any case expected to exceed $d_{PL}$.

Figure 9B:
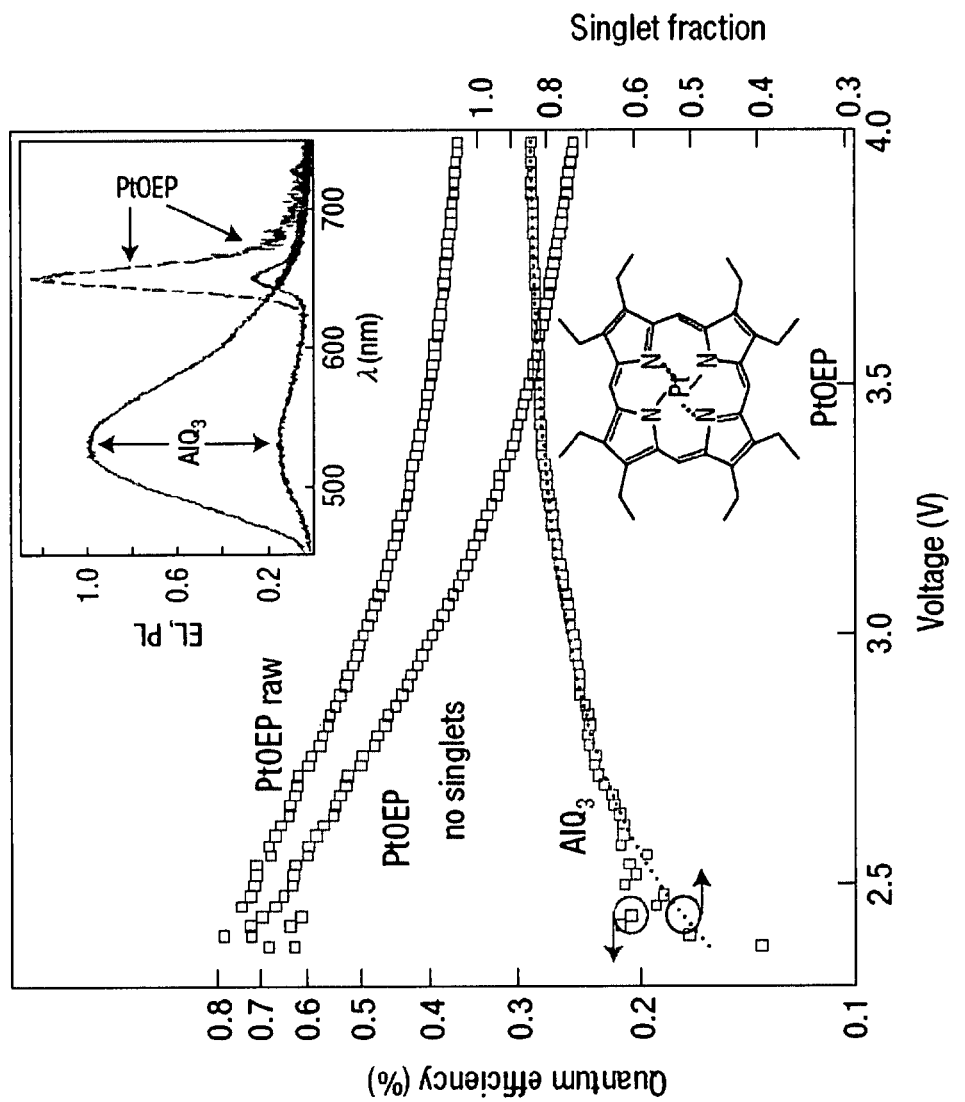

FIG. 9B shows that the minimum $\chi_S$, calculated from Equation (3) with A=1 and an exponential fit to the data, accurately tracks $\eta^{EL}_{AlQ3}$. This result confirms that the voltage dependence of the AlQ$_3$ fluorescent efficiency results from a changing $\chi_S$. At 4V, $\chi_S$=(0.84±0.03), greatly exceeding the zero-mixing limit of $\chi_S$=0.25 and the measured value of $\chi_S$=(0.20±0.01) in AlQ$_3$ (See Segal, M., Baldo, M. A., Holmes, R. J., Forrest, S. R. & Soos, Z. . Phys. Rev. B 68, 075211 (2003)). The increase in $\chi_S$ is also reflected in comparisons of the EL and PL efficiencies (see FIG. 9B inset). The rising value of $\chi_S$ with voltage is consistent with the AlQ$_3$ triplet- and singlet-exciton energies $V_T$=2.05 eV and $V_S$=2.7 eV (See Colle, M. & Garditz, C. Appl. Phys. Lett. 84, 3160 (2004); Burrows, P. E. et al. J. Appl. Phys. 79, 7991 (1996)), so injected carrier pairs are thermally excited to form the singlet exciton for voltages $V_T<V<V_S$. The inset of FIG. 9B is a PL spectra (solid lines) of a film of AlQ$_3$ doped with 0.9% PtOEP, and of a neat film of AlQ$_3$, whose maximum is normalized to unity. The ratio of PtOEP emission to AlQ$_3$ emission from the doped film is f=(0.5±1) (see Equation (3)). The introduction of PtOEP reduces the AlQ$_3$ PL efficiency by a factor of about seven, but reduces the AlQ$_3$ EL efficiency by a factor of about two, from 0.7 to 0.3%. This result is consistent with an increased singlet-exciton fraction. The PtOEP EL emission at 6 V, shown with a dashed line, is significantly enhanced relative to the PtOEP PL emission, primarily owing to the transfer of triplet excitons from AlQ$_3$ with probability $r_T$ of about 1.

Example 5

Figure 10:
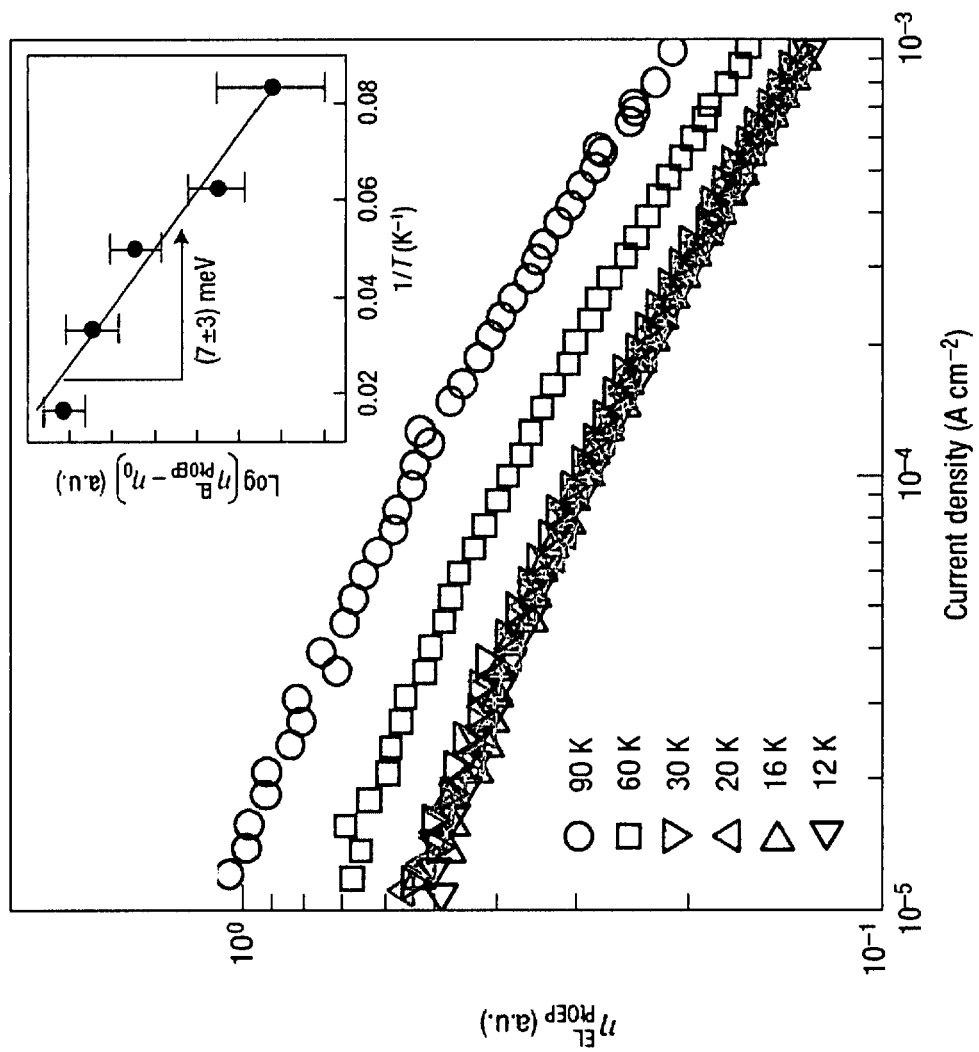
FIG. 10 is a graph of photoluminescence efficiency versus current density for a light emitting device, in accordance with certain examples.

The variation of $\eta^{EL}_{PtOEP}$ from the device used to obtain the results shown in FIG. 9B was examined with current density and temperature. At low temperature, the calculated inversion of the usual singlet-triplet CT-state energetic ordering suggests that the triplet population should vanish and $\chi_S \to 1$. From Equation (2), PtOEP captures both triplet and singlet excitons originally formed on AlQ$_3$. To extract the triplet signal from $\eta^{EL}_{PtOEP}$, $\eta^{EL}_{PtOEP}|_{T\to 0}$ was subtracted. The difference is proportional to the triplet density $(1-\chi_S)$, $$\eta^{EL}_{PtOEP} - \eta^{EL}_{PtOEP|T\to 0} = \qquad (4)$$
$$\eta^{PL}_{PtOEP}(1-dEL)(r_T-r_S)(1-\chi_S) \propto \exp\left(\frac{-|\Delta E_{CT}|}{k_B T}\right)$$

where $k_B$ is Boltzmann's constant and T is temperature. The temperature dependence of $\eta^{EL}_{PtOEP}$ shown in FIG. 10 confirms the presence of a baseline at low temperatures and thermally activated phosphorescence above the baseline. The efficiency rises with temperature, indicating a lower-energy singlet CT state. The inset of FIG. 10 shows that an Arrhenius plot of the triplet signal with $\eta^{EL}_{PtOEP}|_{T\to 0}$ approximately equal to $\eta^{EL}_{PtOEP}|_{T=12 K}$ fits a straight line well, yielding $\Delta E_{CT}=-(7\pm 3)$ meV. $\eta^{PL}_{PtOEP}$ was approximately constant over this temperature range. Singlet-exciton transfer ($r_S$) is not expected to be temperature dependent, and the efficiency of exothermic triplet transfer ($r_T$) from a fluorescent host to PtOEP has been measured to be constant with respect to temperature to within 5% over the relevant temperature range.

The temperature dependence of the OEP and AlQ$_3$ electroluminescent efficiencies was measured from the device used to obtain the results shown in FIG. 9A at these temperatures. The Arrhenius slope of $\eta^{EL}_{PtOEP}$ corrected for each of these efficiencies falls within error of the stated result, confirming that $\Delta E_{CT}$ is not influenced by unforeseen temperature-dependent processes. This measurement of $\Delta E_{CT}$ is consistent in sign but not in magnitude with the calculated values of −70 meV and −25 meV for δ-AlQ$_3$ and α-AlQ$_3$, respectively (FIG. 8B). This discrepancy probably results from a larger average electron-hole separation in the experiments, which involve amorphous films, than in the calculations, which assumed a closely packed crystal structure. The measured value of $\Delta E_{CT}$ suggests that the $\chi_S$ enhancement in AlQ$_3$ is primarily the result of $k_S>k_T$, rather than the energetic ordering of the CT states. But measurements of $\chi_S=0.84$ and $\chi_S<0.25$ in the presence and absence, respectively, of spin-orbit coupling confirm that CT state mixing is usually slow relative to $k_S$ and $k_T$. The measured splitting is sufficient to significantly reduce mixing rates.

This demonstration of $\chi_S$ being much greater than 0.25 in the AlQ$_3$:PtOEP system suggests that engineering the CT mixing interaction can enable significant increases in the fluorescence efficiency of low-molecular-weight organic light emitting devices, but an increase in fluorescent efficiency was not achieved in the AlQ$_3$:PtOEP device of FIG. 9A because AlQ$_3$ singlet excitons transfer to PtOEP, or are mixed to the triplet state. Thus, to enhance fluorescence, an device should mix charge transfer states but not formed excitons.

Example 6

Figure 11A:
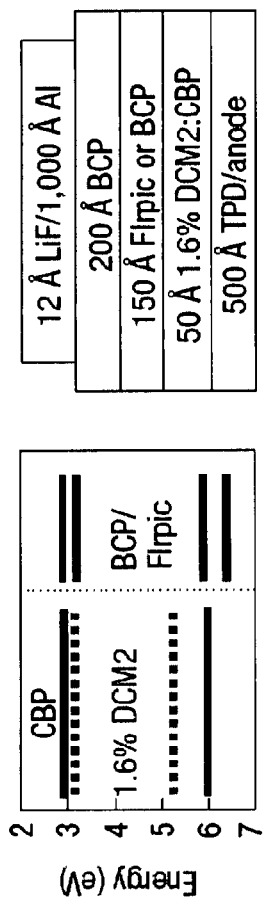
FIG. 11A is a schematic of a light emitting device and FIG. 11B is a graph of quantum efficiency versus voltage for the lighting device of FIG. 11A, in accordance with certain examples.

In this example, we describe a light emitting device with a selective CT mixing layer (see FIG. 11A). As in other heterostructure organic light emitting devices (OLEDs), excitons are formed on the lower-energy side of the interface between the hole transport layer (HTL) and the electron transport layer (ETL). The emissive material used in this device was the red emitter DCM2. It was inserted on the HTL side of the interface in a narrow layer just 50 Angstroms thick, to minimize the possibility of efficiency artifacts caused by shifts in the exciton-formation zone. DCM2 is doped into the host material 4,4-N,N-dicarbazolyl-biphenyl (CBP) at 1.6% molar concentration to prevent 'concentration quenching' of its emission. From the energy levels in FIG. 11A, DCM2 is the lowest energy site and is likely to host exciton formation at its interface with the ETL.

To obtain CT state mixing, an ETL consisting of a thin film of iridium(III) bis[(4,6-difluorophenyl)pyridinato-N,C2] picolinate (FIrpic) was used. The presence of iridium in FIrpic enhances spin-orbit coupling and mixes the spin state of the electron it carries. The spin of the CT state consisting of an electron on FIrpic and a hole on DCM2 is therefore also mixed. Further, calculations similar to those described above give a singlet-triplet CT gap of 60 meV for a FIrpic−/DCM2+ heterodimer. Thus the interfacial CT states should be appreciably split. FIrpic will not quench DCM2, as FIrpic phosphoresces in the blue-green. It is used in this example, however, purely as an ETL without any substantial light emission. Indeed, its electroluminescent quantum efficiency is only 0.2% in a neat film. In addition, FIrpic's spin mixing effect on neighboring molecules is reduced by the bulky side groups which surround its central heavy-metal atom, reducing inter-system crossing effects in DCM2. In a control device, the FIrpic ETL is replaced by an ETL with low spin-orbit coupling: 2,9-dimethyl-4,7-diphenyl-1,10-phenanthroline (BCP). To constrain the emissive layer on the HTL side an additional HTL was used: N,N-bis(3-methylphenyl)-[1,1-biphenyl]-4,4-diamine (TPD).

Figure 11B:
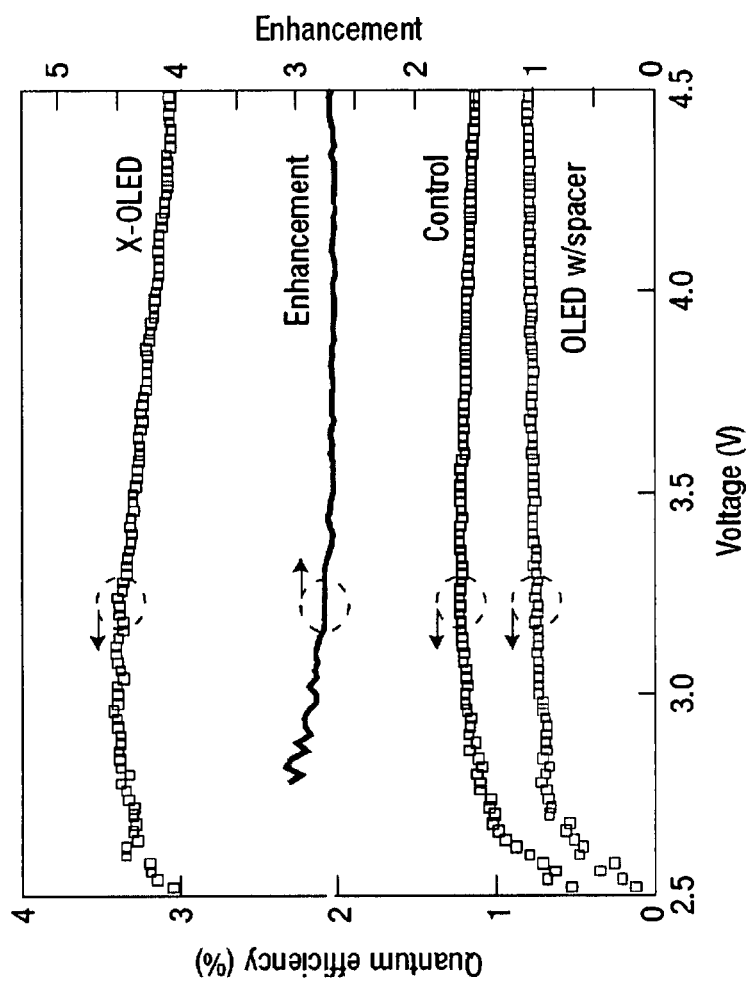

FIG. 11B compares the performance of the lighting device with the mixing agent (X-OLED) to the control device without the mixing agent. The external quantum efficiency of the X-OLED reaches a maximum of 3.4%, or 2.8 times larger than the control. An OLED identical to the X-OLED but with the FIrpic layer spaced from DCM2 by 100 Angstroms of BCP did not show enhanced efficiency. This result was consistent with mixing at the exciton formation interface.

Figure 12:
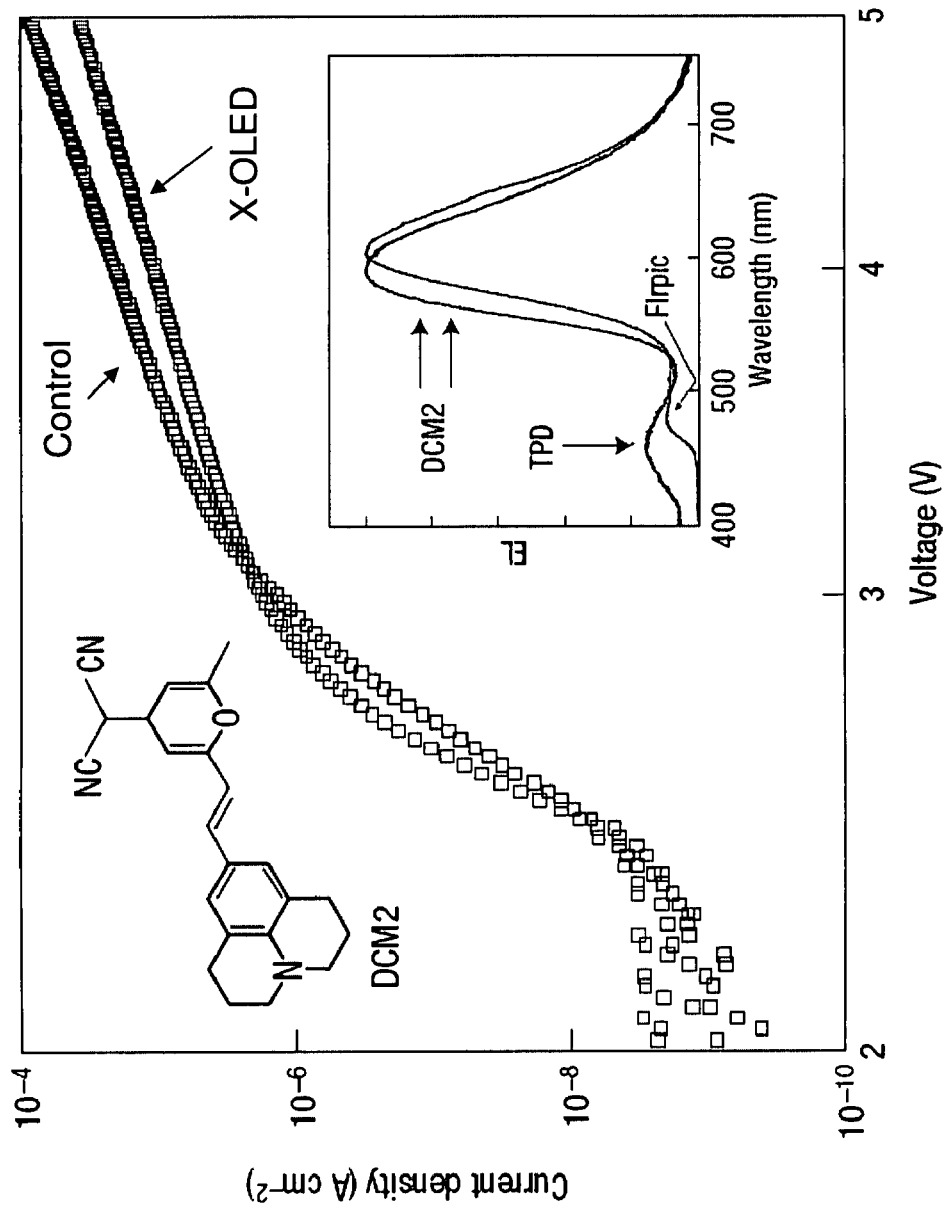
FIG. 12 is a graph of current density versus voltage for a lighting device, in accordance with certain examples.

FIG. 12 compares the current-voltage (I-V) characteristic and 6 EL spectrum of the X-OLED device with its control. There are no significant differences in the I-V characteristics of the two OLEDs, confirming that the enhancement by the mixing agent is not due to variations in charge balance. The spectra of the two devices are also similar, although a small FIrpic shoulder is observed from the X-OLED and a small TPD shoulder is observed from the control, probably due to discontinuities in the thin emissive layers. The small red-shift in the DCM2 emission in the X-OLED as compared with the control is likely due to the higher dipole moment of FIrpic.

Example 7

Figure 13:
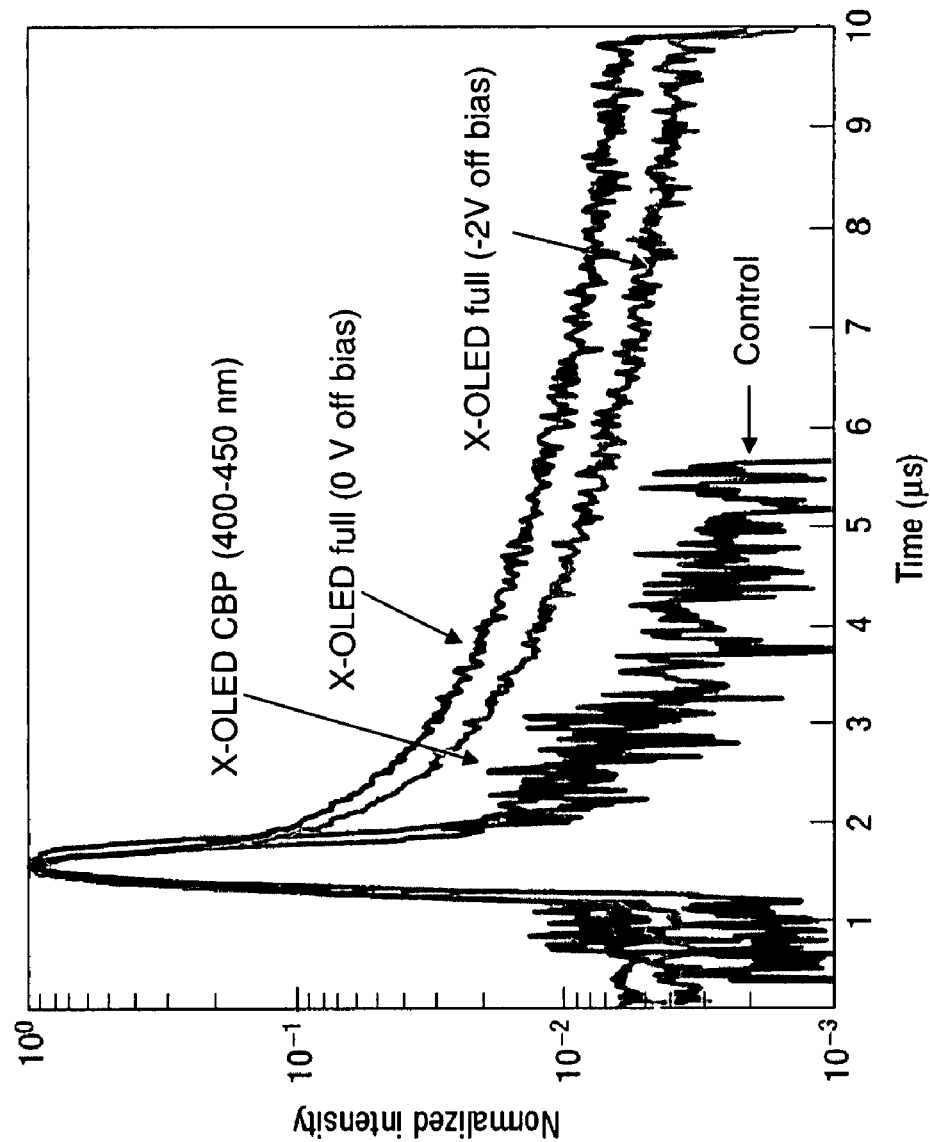
FIG. 13 shows transient measurements made with a streak camera, in accordance with certain examples.

To verify that the X-OLED device described in Example 6 emits light by fluorescence and not sensitized fluorescence or phosphorescence, spectral- and time-resolved transient measurements were made with a streak camera, as shown in FIG. 13. The raw data contained a very small shoulder in the spectral range $400<\lambda<450$ nm, which was attributed to fluorescence from the CBP host. The CBP transient may be taken as the RC-limited response of the OLED. The transient of the control device is also RC limited, with the same time constant $\tau<55$ ns. The full X-OLED response is observed to follow the same RC limit with the addition of a slow tail that comprises less than 10% of the total emission. By varying the reverse bias applied after the excitation pulse, the slow transient is demonstrated to be influenced by charge storage, that is, a larger reverse bias speeds the removal of carriers from the OLED and quenches the slow transient. Thus, the X-OLED transient response shows that (1) the fast initial DCM2 transient is exactly as expected for fluorescence given the RC limitation of this OLED and (2) the slow tail is not evidence of sensitized fluorescence.

The mixing agents may be used in light emitting devices lacking an emissive phosphor and may be used with existing stable fluorescent materials. Use of a mixing agent can achieve 100% internal quantum efficiency.

Example 8

Figure 14A:
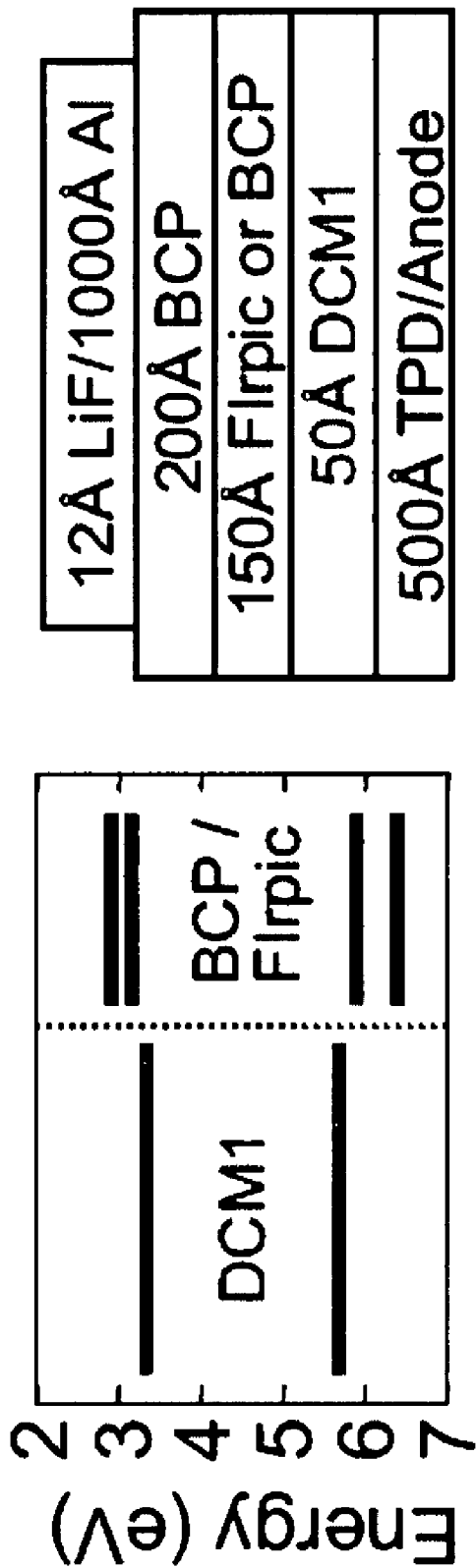
FIG. 14A is a schematic of a light emitting device and FIG. 14B is a graph of current density versus voltage for the device of FIG. 14A, in accordance with certain examples.
Figure 14B:
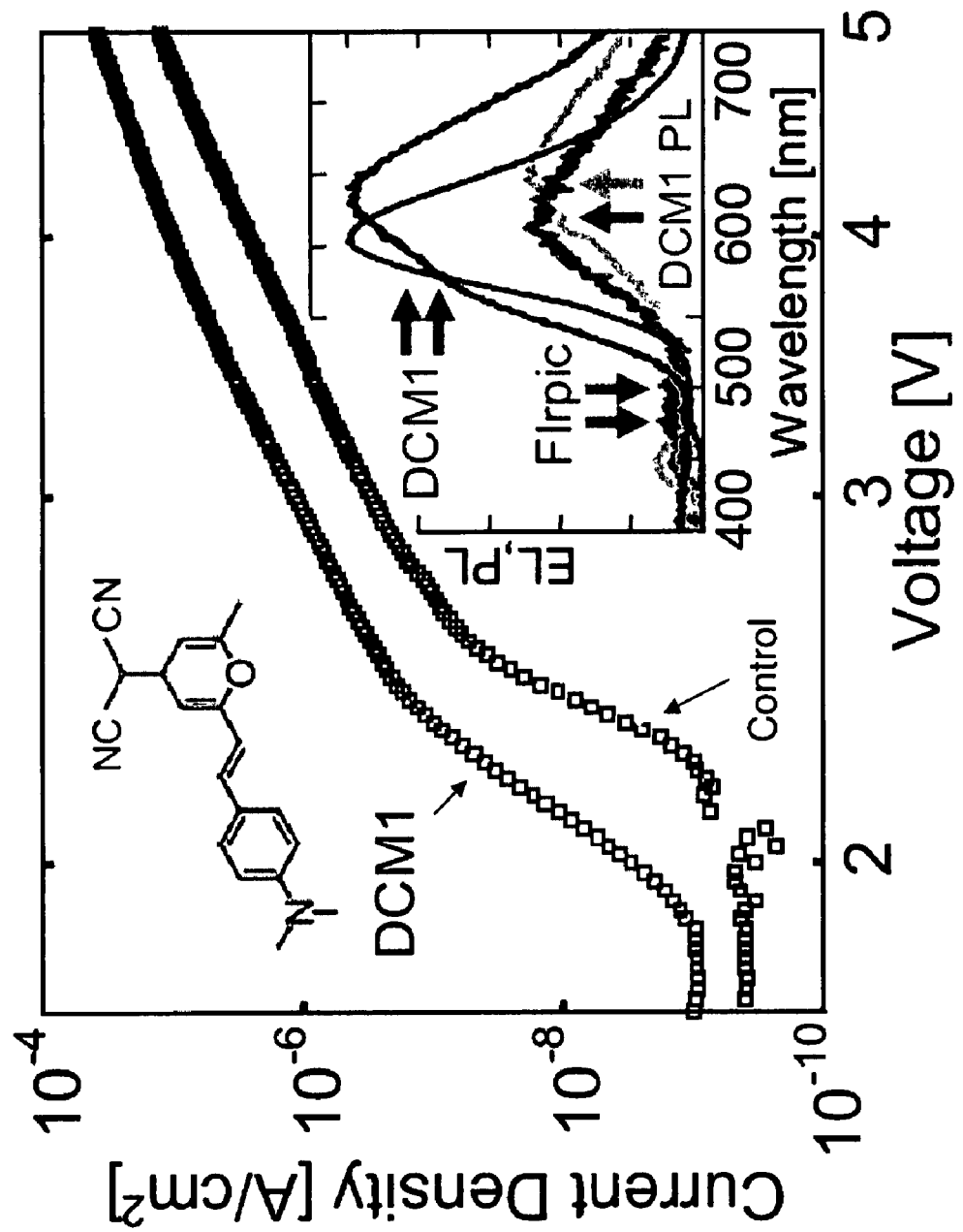
Figure 15:
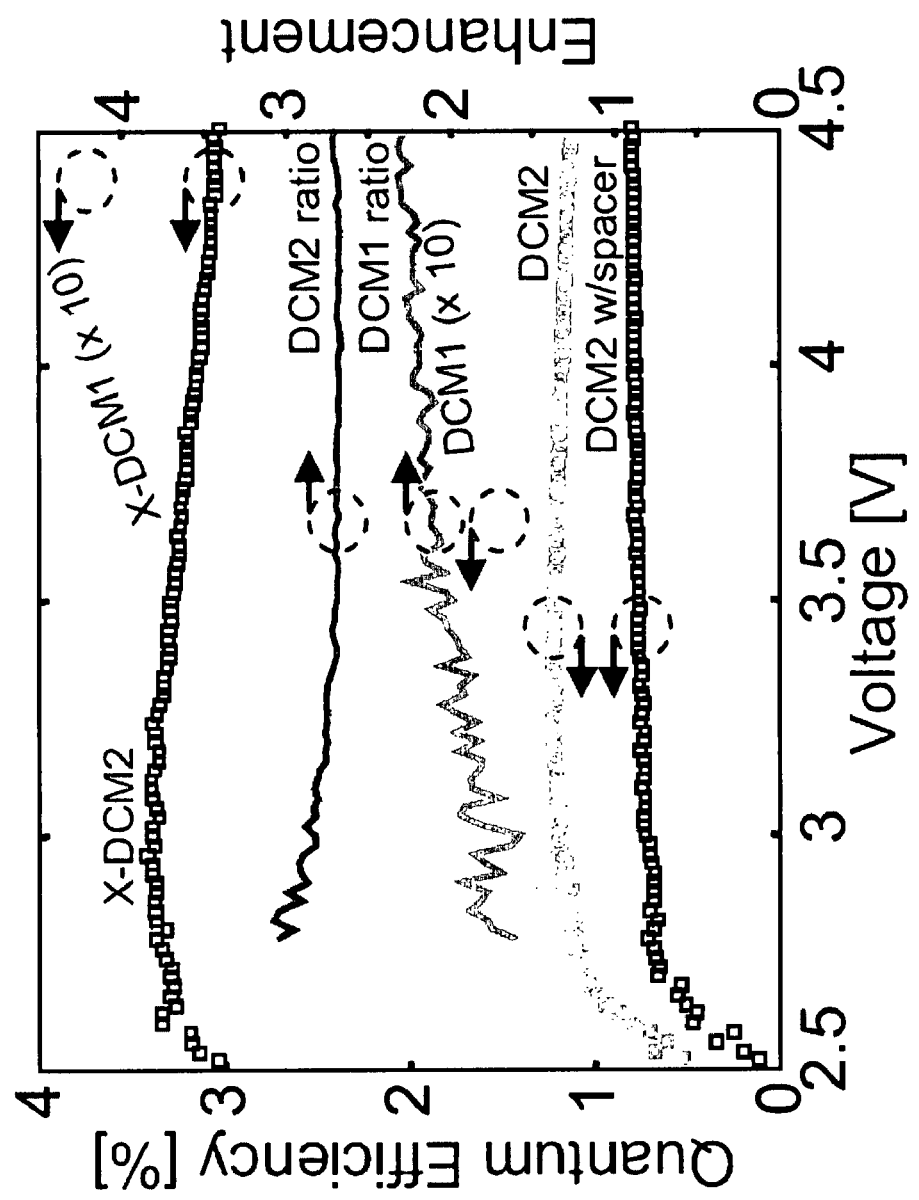
FIG. 15 is a graph of quantum efficiency versus voltage, in accordance with certain examples.

FIG. 14A shows the structure of a second X-OLED ("X-DCM1"), identical to the X-OLED described in Example 6 except that the CBP:DCM2 layer is replaced by a layer of neat (i.e. undoped) DCM. X-DCM1 exhibited a 2.3 times enhancement in external quantum efficiency relative to a control device, in which the FIrpic layer is replaced by BCP. FIG. 14B compares the current voltage characteristic and PL and EL spectra of X-DCM1 to its control. Both the PL and EL spectra of X-DCM1 are red-shifted with respect to the control. The PL efficiencies of DCM1 next to BCP or FIrpic, however, are similar, so this shift cannot account for the enhancement in EL efficiency. FIG. 15 adds the external quantum efficiency of X-DCM1 and its control to FIG. 11B. X-DCM1 achieves an external quantum efficiency of 0.38% at V=4.5 V, or 2.3 times larger than its control, suggesting a singlet fraction $\chi_S$ of 0.58 in DCM1. The absolute efficiencies of the DCM1 devices are believed to be lower than the DCM2 devices due to 'concentration quenching' in the neat film of DCM1. The energy level diagram in FIG. 14A shows that excitons will form on DCM1 as it is the lowest energy material contained between the ETL and the HTL. In addition, a hole injection barrier between FIrpic and DCM1 prevents exciton formation in FIrpic. Therefore, the efficiency enhancement of X-DCM1 is not due to sensitized fluorescence. In addition, the efficiency enhancement is preserved in this device despite the absence of the host material CBP used in the X-DCM2 devices, demonstrating that CBP does not participate in the enhancement. Rather, the exciton precursor in both devices is FIrpic$^-$/DCM$^+$ which collapses to an exciton on DCM.

Example 9

FIG. 13 shows that the lifetime of the DCM2 emission matches the RC limit of the device, and shows no evidence of sensitized fluorescence from slowly decaying triplets in FIrpic. In principle, however, sensitized fluorescence can yield transient lifetimes that approach those of fluorescence. The limiting step is triplet to singlet energy transfer from the phosphorescent sensitizer to the fluorophore, and Förster energy transfer quenches the normally long-lived triplet. The quenching is a complicated function of the device structure and the Förster overlap between the phosphorescent donor and fluorescent acceptor. In the X-OLED, interpreting the efficiency enhancement as due to sensitization would require that DCM2 reduce the radiative lifetime of FIrpic from 1.2 µs to less than the RC limit of 55 ns, a factor of 22 or more. However, when DCM2 is sensitized by Ir(ppy)$_3$, DCM2 is observed to reduce the radiative lifetime of Ir(ppy)$_3$ from ~1.3 µs to 140 ns, a factor of only 9. This difference in quenching occurs despite the fact that the phosphor is blended with DCM2 in the sensitized device, rather than separated into two half spaces by an interface. Thus, in contrast with the apparent quenching ratios, the overlap between phosphor and fluorophore is greater in the sensitized device.

Furthermore, the discrepancy cannot be explained by a varying DCM2 concentration or differing Förster radii. As evidenced by the device EL spectra, which provide the most sensitive measure of DCM2 concentration, DCM2 is doped at approximately the same concentration in CBP in both devices, and the Förster radii of Ir(ppy)-DCM2 and FIrpic-DCM2 are also similar, 37 Angstroms and 40 Angstroms respectively. Thus, the short transient lifetime of DCM2 in the X-OLED cannot be explained by sensitized fluorescence. As noted in Example 8, sensitization requires exciton formation in FIrpic. Given that holes are trapped in DCM2, there is a large hole injection barrier into FIrpic, but little or no electron barrier between FIrpic and DCM2. The elimination of the CBP host removes any possibility that holes are transported into FIrpic via the deeper CBP HOMO. Yet, the efficiency enhancement persists. FIrpic is also a poor exciton donor, with an EL quantum efficiency of just 0.2%.

The observation of an enhanced singlet fraction in AlQ$_3$ in the presence of PtOEP is not due to sensitized fluorescence. PtOEP is an acceptor and not a phosphorescent donor to AlQ$_3$. Thus, there is no sensitization pathway in that device, yet $\chi_S \gg 25\%$ is observed.

Example 10

The ordering of singlet and triplet CT states was previously studied by Kadashchuk, et al. Phys. Rev. Lett. 93 (6), 066803 (2004). Their work drew two conclusions. First, thermally stimulated luminescence (TSL) in MeLPPV indicated that triplet geminate pairs were typically 3-6 meV lower than their singlet counterparts. Meanwhile, INDO calculations on polyphenylene oligomers in a particular configuration gave S-T gaps similar to (if somewhat larger than) the experimental results. The obvious conclusion was that triplet CT states are lower than their singlet counterparts, in contrast to the present findings. The examples described above reconcile these different findings.

On the theoretical side, a more extensive study of the S-T splitting in the phenylene oligomer dimer studied by Kadaschuk, et al was performed. These calculations are analogous to the AlQ$_3$ calculations above—constrained B3LYP in a 3-21basis was used to isolate the two spin states for the CT pair and evaluate the splitting. In this smaller basis set, the magnitude of the gap was expected to be overestimated by approximately a factor of two compared to the results above, but trends should be accurately reproduced. Two monomers were held at a fixed separation of 3.75 Angstroms in all cases, as a typical intermolecular distance achieved in small molecule thin films. If the oligomers were placed in a parallel cofacial arrangement (as was done in Kadashchuk, et al.) the same qualitative result was obtained: the singlet CT state lies above the triplet. However, if one monomer is allowed to slide parallel to the other, a very rapid change in the S-T gap is observed.

Figure 16:
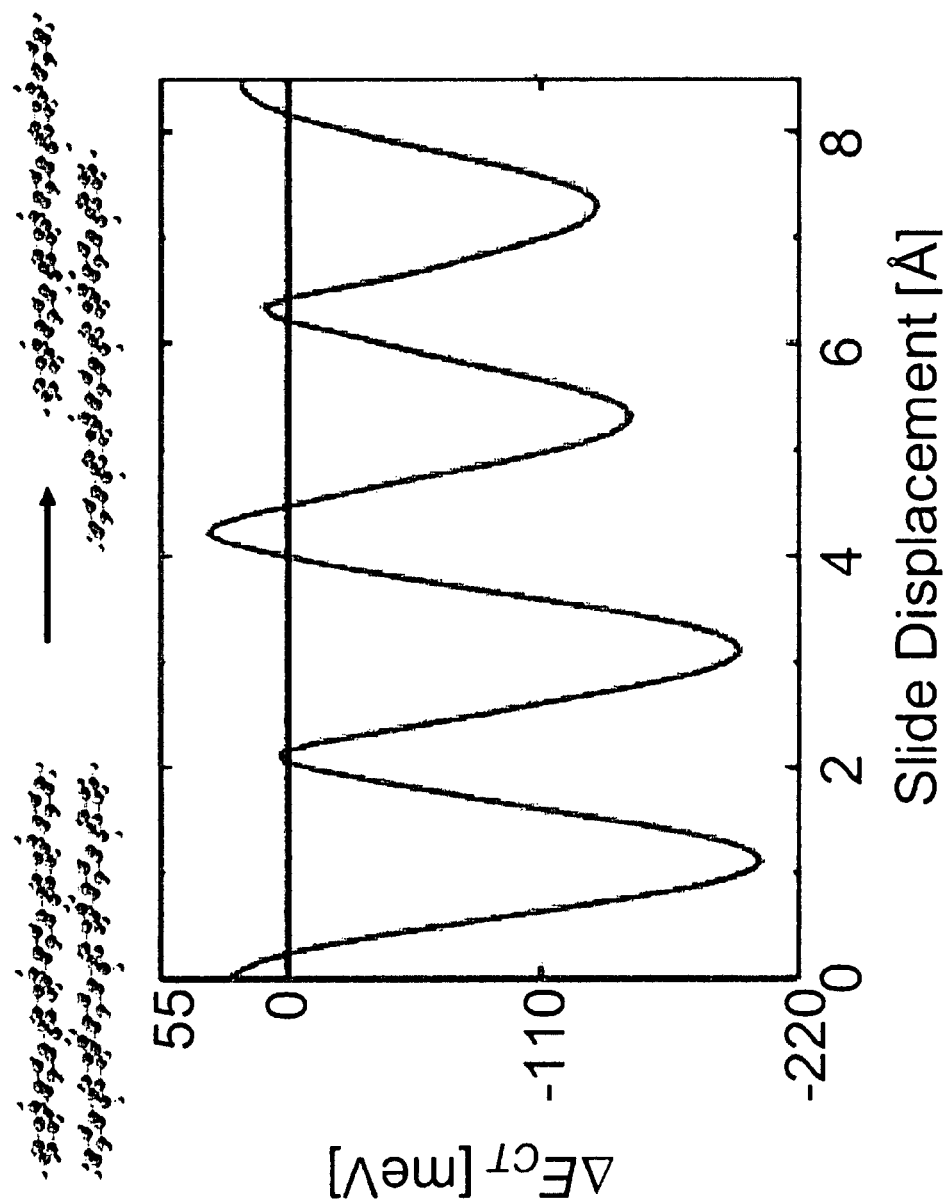
FIG. 16 is a graph of energy difference versus slide displacement, in accordance with certain examples.

Referring to FIG. 16, even for this molecule the singlet state is usually lower and the deepest traps are clearly associated with singlets. When considered in this manner, the original geometry appears to be more an anomaly than the norm. Taken together the results for phenylene oligomers support the conclusion that while the singlet-triplet gap is material dependent, it is possible and even probable that the singlet CT state lies lower in typical devices.

On the experimental side, there is no conflict in principle between Kadashchuk, et al and this work. The S-T gap in the CT state is likely to be material dependent, so it should not be surprising if a polymeric system like MeLPPV has a different CT S-T ordering than a small molecule system like $AlQ_3$. Nevertheless, in a material with a dispersion of S-T gaps, the a TSL measurement will likely select those CT pairs with stabilized triplets.

In an illustrative TSL measurement, the measurement began with optical excitation of a film of MeLPPV at T=4.2 Kelvin for 30 seconds. After the excitation is removed, there was a short dwell time that allows the CT states to equilibrate. Then, the temperature was slowly increased and the thermally-stimulated fluorescence and phosphorescence was recorded. The data unequivocally demonstrated that fluorescence required 3-6 meV additional thermal activation. During the dwell time, however, it was assumed that the CT states occupied the lowest energy spin configuration, which the theory suggests is a singlet in some locations. But singlet CT states can decay to the (singlet) ground state, whereas this decay process is nominally forbidden for triplet CT states. Thus, it is possible that the dwell time effectively selects only those sites with stabilized triplet CT states. Consistent with this model, the afterglow fluorescence decays within 5 µs, but phosphorescence is observed after 103 seconds, approximately, three order of magnitude longer than the triplet exciton lifetime.

When introducing elements of the aspects, embodiments and examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A light emitting device configured to emit light by fluorescence comprising:
    a first electrode;
    a second electrode;
    an emissive material between the first and second electrodes; and
    a non-emissive mixing agent layer separate from the emissive material and between at least one of the first electrode and the emissive material or the second electrode and the emissive material, the mixing agent layer is effective to mix charge transfer states to increase the fraction of excitons formed as a singlet state.

2. The device of claim 1, wherein the first electrode is configured to be biased by an energy source to provide electrons.

3. The device of claim 2, further comprising an electron transport layer between the first electrode and the emissive material.

4. The device of claim 2, in which the mixing agent layer includes an electron transport layer disposed between the first electrode and the emissive material.

5. The device of claim 4, further comprising a second non-emissive mixing agent layer which comprises a hole transport layer between the second electrode and the emissive material, wherein the second mixing agent layer is effective to increase the fraction of excitons formed as a singlet state.

6. The device of claim 2, further comprising a hole transport layer between the second electrode and the emissive material.

7. The device of claim 2, in which the mixing agent layer includes a hole transport layer disposed between the second electrode and the emissive material.

8. The device of claim 1, in which the mixing agent layer is between the first electrode and the emissive material and between the second electrode and the emissive material and abuts the emissive material.

9. The device of claim 1, in which the mixing agent layer comprises at least one complexed transition metal.

10. The device of claim 1, in which the mixing agent layer comprises a complexed heavy atom that is buffered from adjacent molecules by ligands of the complexed heavy atom to reduce triplet state exciton formation.

11. The device of claim 1, in which the mixing agent layer is effective to increase the fraction of excitons formed as a singlet state to greater than 25% of the total excitons formed.

12. The device of claim 1, in which the mixing agent layer is effective to convert triplet charge transfer states into singlet charge transfer states.

13. The device of claim 1, in which the mixing agent layer comprises an atom having an atomic number greater than or equal to 37.

14. The device of claim 13, in which the mixing agent layer comprises an atom having an atomic number from 71 to 85.

15. The device of claim 1, in which the emissive material is selected to emit blue light.

16. The device of claim 1, in which the mixing agent layer is arranged in a separate layer to mix the charge transfer states to increase the fraction of excitons formed as a singlet state without substantial mixing of formed excitons.

17. The device of claim 1, wherein the mixing agent layer is not a phosphor or a phosphorescent sensitizer.

18. A method of providing a light emitting device configured to emit light by fluorescence comprising:
    providing a first electrode, a second electrode, and an emissive material between the first electrode and the second electrode; and
    providing a non-emissive mixing agent layer between the first electrode and the second electrode and separate from the emissive material, the mixing agent layer is effective to mix exciton precursor states to increase the fraction of excitons formed as a singlet state.

19. The method of claim 18, further comprising applying a voltage across the first electrode and the second electrode of the light emitting device to provide emission from the emissive material.

20. The method of claim 19, further comprising configuring the applied voltage to be at least 10% lower than an applied voltage needed to generate a substantially similar emission from a light emitting device comprising the first electrode, the second electrode, the emissive material and no mixing agent layer.

21. The method of claim 18, further comprising configuring the first electrode to be biased by an energy source to provide electrons.

22. The method of claim 18, further comprising providing an electron transport layer between the first electrode and the emissive material.

23. The method of claim 22, further comprising providing a hole transport layer between the second electrode and the emissive material.

24. The method of claim 23, further comprising providing an atom having an atomic number greater than or equal to 37 as the mixing agent layer.

* * * * *